United States Patent [19]
Min et al.

[11] Patent Number: 4,970,174
[45] Date of Patent: Nov. 13, 1990

[54] METHOD FOR MAKING A BiCMOS SEMICONDUCTOR DEVICE

[75] Inventors: Sung-Ki Min, Inchun; Chang-Won Kahng, Seoul; Uk-Rae Cho, Kyoungsangbuk; Jong-Mil Youn, Daegu; SukGi Chio, Seoul, all of Rep. of Korea

[73] Assignee: Samsung Electronics Co., Ltd., Suwon City, Rep. of Korea

[21] Appl. No.: 244,810

[22] Filed: Sep. 15, 1988

[30] Foreign Application Priority Data

Sep. 15, 1987 [KR] Rep. of Korea ............... 1987-10225

[51] Int. Cl.[5] .................... H01L 21/72; H01L 21/76; H01L 27/00
[52] U.S. Cl. ........................................ 437/51; 437/31; 437/33; 437/34; 437/56; 437/57; 437/59; 437/44; 148/DIG. 124; 148/DIG. 9; 357/43
[58] Field of Search ...................... 437/31, 33, 34, 51, 437/56, 57, 59, 44; 148/DIG. 9, DIG. 124; 357/43, 59 G, 59 H

[56] References Cited

U.S. PATENT DOCUMENTS

| | | | |
|---|---|---|---|
| 4,256,515 | 3/1981 | Miles et al. | 437/59 |
| 4,299,024 | 11/1981 | Piotrowski | 437/38 |
| 4,346,512 | 8/1982 | Liang et al. | 437/59 |
| 4,445,268 | 5/1984 | Hirao | 437/31 |
| 4,475,279 | 10/1984 | Gahle | 437/31 |
| 4,484,388 | 11/1984 | Iwasaki | 437/59 |
| 4,486,942 | 12/1984 | Hirao | 437/59 |
| 4,497,106 | 2/1985 | Momma et al. | 437/59 |
| 4,604,790 | 8/1986 | Bonn | 437/57 |
| 4,628,341 | 12/1986 | Thomas | 357/43 |
| 4,697,202 | 9/1987 | Sher | 357/43 |
| 4,707,456 | 11/1987 | Thomas et al. | 437/59 |
| 4,717,686 | 1/1988 | Jacobs et al. | 437/56 |
| 4,727,046 | 2/1988 | Tuntaood et al. | 437/54 |
| 4,734,382 | 3/1988 | Krishna | 437/31 |
| 4,735,911 | 4/1988 | Schaber | 437/33 |
| 4,737,472 | 4/1988 | Schaber et al. | 437/59 |
| 4,752,589 | 6/1988 | Shaber | 437/31 |
| 4,772,567 | 9/1988 | Huan | 437/33 |
| 4,783,483 | 12/1988 | Yamauchi | 437/33 |
| 4,799,098 | 1/1989 | Ikeda et al. | 357/43 |
| 4,806,499 | 2/1989 | Shinohara | 437/31 |
| 4,808,547 | 2/1989 | Beasom | 437/54 |
| 4,808,548 | 2/1989 | Thoma et al. | 437/57 |
| 4,818,720 | 4/1989 | Iwasaki | 437/58 |

FOREIGN PATENT DOCUMENTS

| | | | |
|---|---|---|---|
| 0147626 | 7/1985 | European Pat. Off. | 357/43 |
| 0226892 | 7/1987 | European Pat. Off. | 357/43 |
| 0279943 | 8/1988 | European Pat. Off. | 357/43 |
| 0282734 | 9/1988 | European Pat. Off. | 357/43 |
| 0165354 | 7/1987 | Japan | 357/43 |
| 2143082 | 1/1985 | United Kingdom | 357/43 |
| 2164790 | 3/1986 | United Kingdom | 357/43 |
| 2126117 | 8/1987 | United Kingdom | 357/43 |
| 85/03598 | 8/1985 | World Int. Prop. O. | 357/43 |

OTHER PUBLICATIONS

(Author unknown), "Process Techniques for Merging Bipolar and CMOS Devices on the Same Chip", IBM Technical Disclosure Bulletin, vol. 30, No. 8, Jan. 1988, pp. 301-308.

(Author unknown), "Field-Defined Bipolar Structure in CMOS Techology", IBM Technical Disclosure Bulletin, vol. 29, No. 1, Jun. 1986, pp. 258-259.

Kobayashi et al., "Bipolar CMOS-Merged Technology for a High-Speed 1-MBit DRAM", IEEE Trans. on Electron Devices, vol. 36, No. 4, Apr. 1929, pp. 706-711.

*Primary Examiner*—Brian E. Hearn
*Assistant Examiner*—M. Wilczewski
*Attorney, Agent, or Firm*—Robert E. Bushnell

[57] ABSTRACT

A method with less processing steps for making a BiCMOS semiconductor device which can be used both in high-integration, high-speed digital devices and in precise analog devices by forming within a single substrate a CMOS transistor, a metal contact emitter bipolymer transistor having the high load driving power and highly effective matching characteristics, and a polycrystalline silicon emitter bipolar transistor having a high-speed characteristic at a low current level. Said device includes a first and a second MOSFET, and a first and a second bipolar transistor on a first conductivity-type silicon substrate, wherein performing a second conductivity-type of ion-implantation for producing a first substrate region to thereon form the first MOSFET, and a third and a fourth substrate region to thereon form the first and second bipolar transistors, respectively on said substrate. The second MOSFET is subsequently formed in a second substrate region being located between the first and third substrate regions.

36 Claims, 19 Drawing Sheets

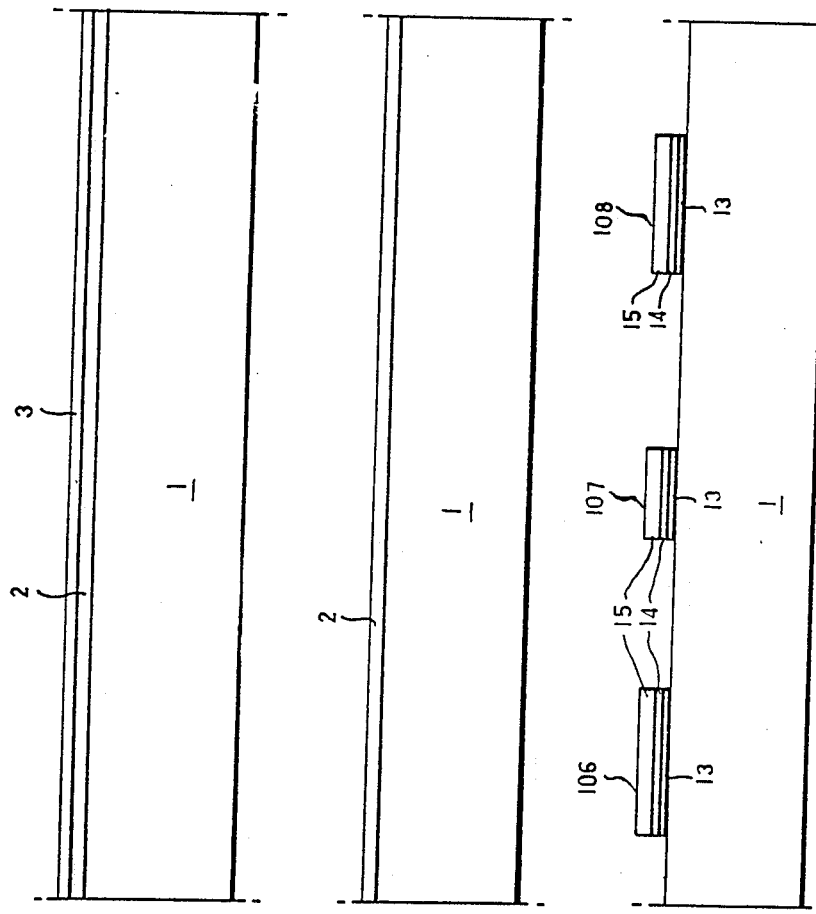

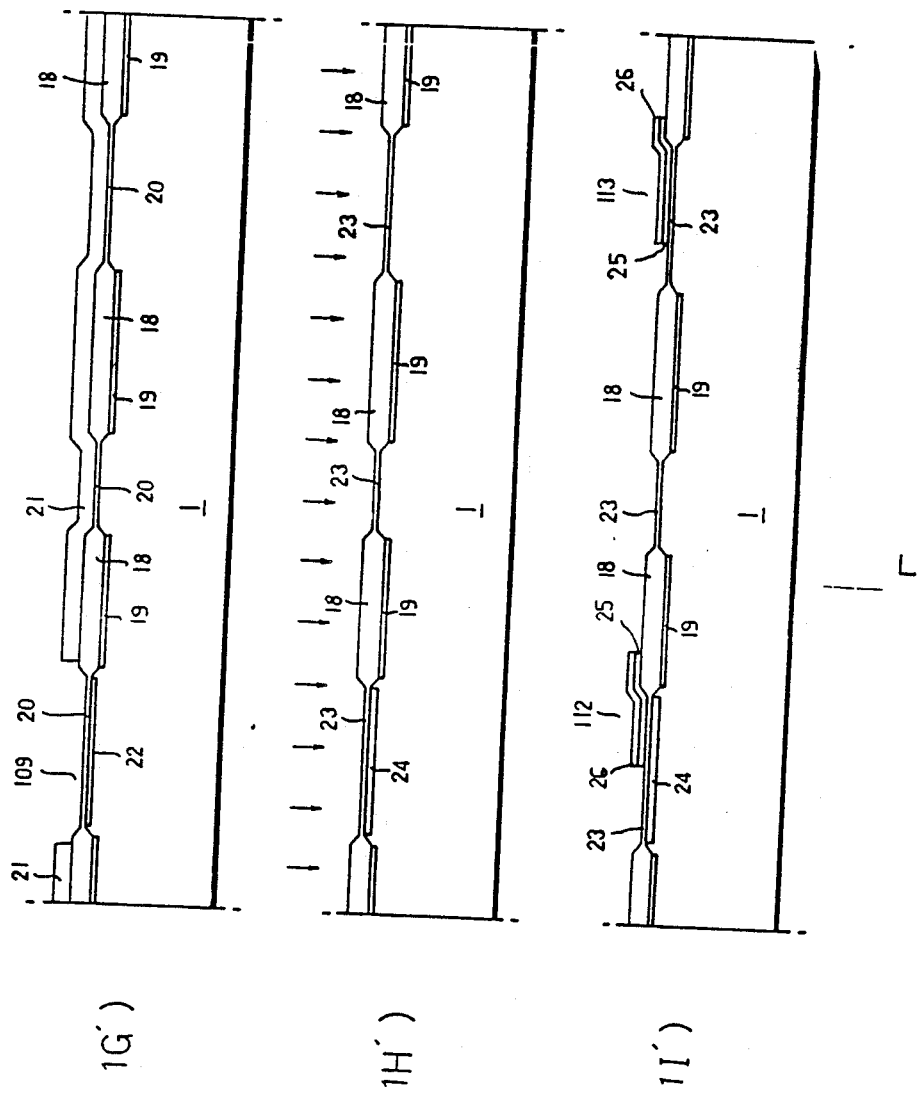

1J')

1K')

1L')

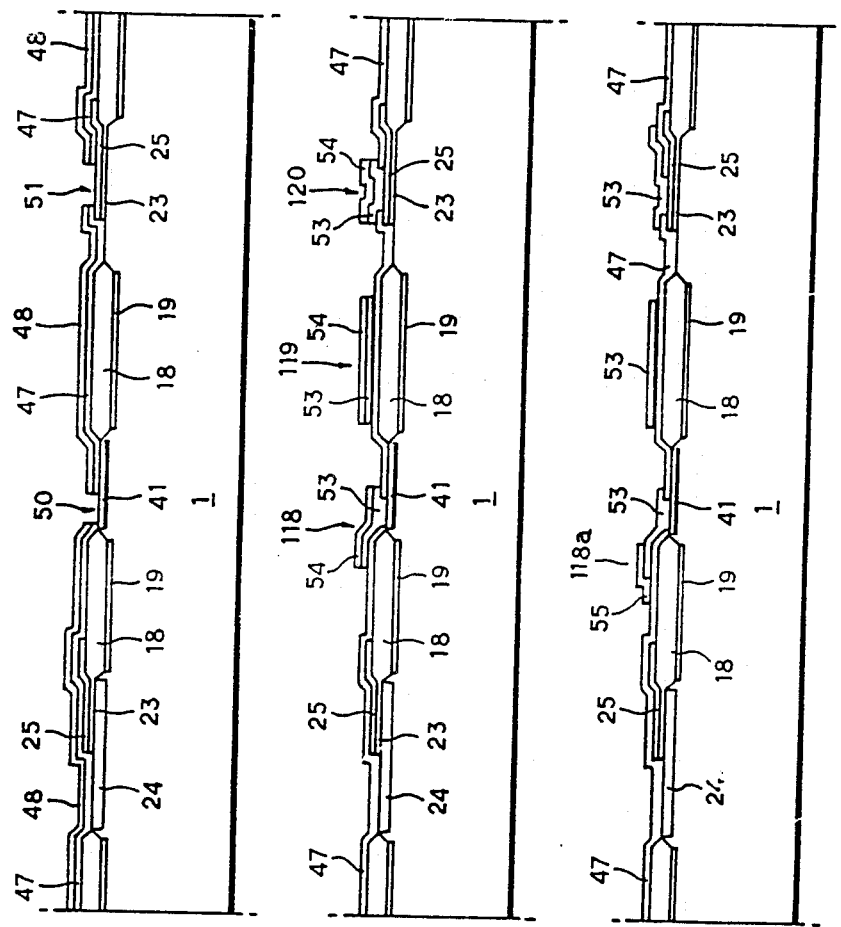

METHOD FOR MAKING A BiCMOS SEMICONDUCTOR DEVICE

BACKGROUND OF THE INVENTION

This invention relates to a method for making a semiconductor device, and more particularly to an improved method for making on a single semiconductor chip a semiconductor device having bipolar transistors, CMOS transistors, MOS capacitors and resistors formed on a single-crystal silicon semiconductor substrate.

A semiconductor device having bipolar transistors and CMOS transistors on a single semiconductor substrate, is generally called a BiCMOS device. VLSI-class BiCMOS technology of a prior art is mainly suitable for use in high-integration and high-speed logic or memory devices because it has been primarily developed for such objects. The BiCMOS technology of prior art for high-performance memory and logic devices has been disclosed in ISSCC Digest of Technical Papers, page 212, February 1986 and in CICC Technical Digest, page 68, May 1986, respectively. In achieving high-performance digital and analog VLSI devices on a single chip with the prior art, there are often limits in the performance and application because there are not optimized and prepared therein for MOS elements, bipolar elements, resistors and capacitors to simultaneously perform precise analog functions and high-speed, high-integration digital functions. In the meanwhile, the influence that the interface between single-crystal emitter region and polycrystalline silicon in a polycrystalline silicon emitter bipolar transistor element has upon the characteristic of elements and circuits, has been disclosed in IEEE, ED-34 NO. 6, PP 1346-1353, June 1987 and in Symposium VLSI Technical Digest papers, PP 47-48, May 1986.

OBJECT OF THE INVENTION

It is therefore an object of this invention to provide with less processing steps a method for making a BiCMOS semiconductor device which can be used both in high-integration, high-speed digital devices and in precise analog devices by forming within a single substrate a CMOS transistor, a metal contact emitter bipolar transistor having the high load driving power and highly effective matching characteristics, and a polycrystalline silicon emitter bipolar transistor having a high-speed characteristic at a low current level.

It is another object of the invention to provide a method for making a BiCMOS semiconductor device capable of obtaining the most effective elements with the least processing steps by means of forming MOS capacitors and resistors on a single semiconductor chip including the MOS and bipolar transistors, and therein making their inter-connections effective.

BRIEF DESCRIPTION OF THE DRAWINGS

The above objects, advantages and features of the present invention will become more readily apparent from a review of the following specification when taken in conjunction with the drawings:

FIGS. 1(A)–(T) and 1(A')–(T') are cross-sectional views sequentially illustrating the processing steps of a preferred embodiment according to this invention;

DETAILED DESCRIPTION OF THE INVENTION

Figure 1:
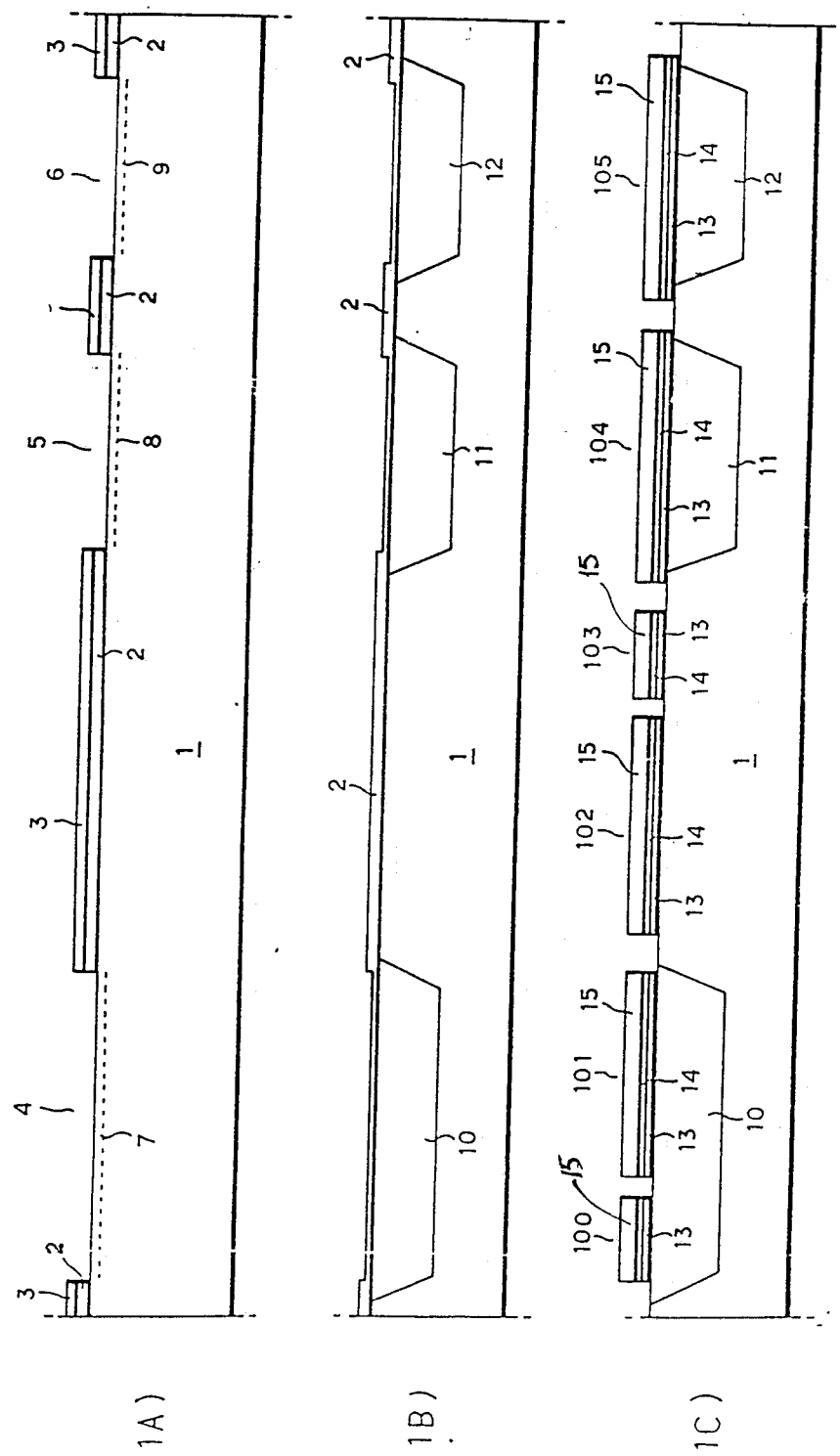
Figure 1:
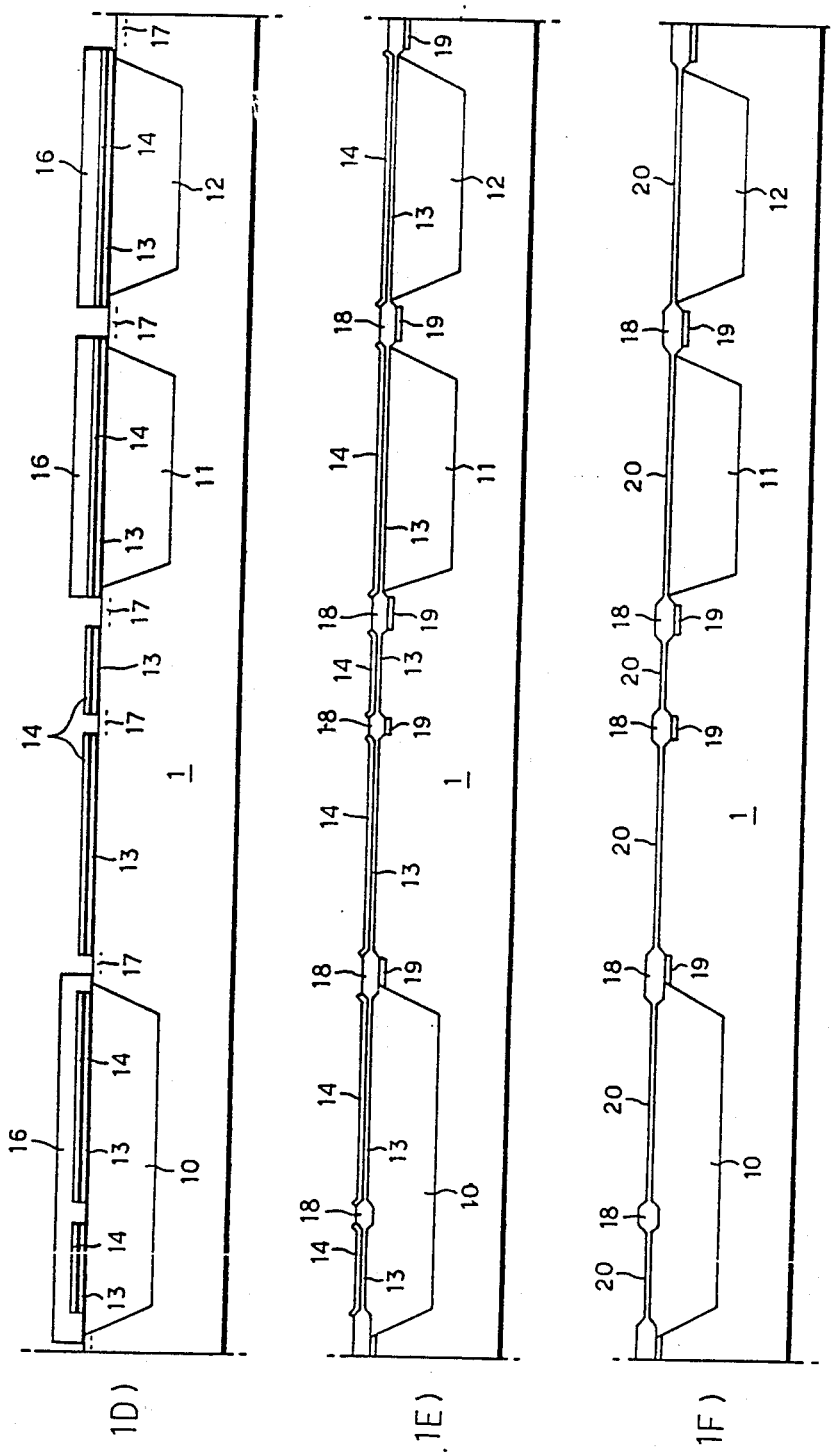
Figure 1:
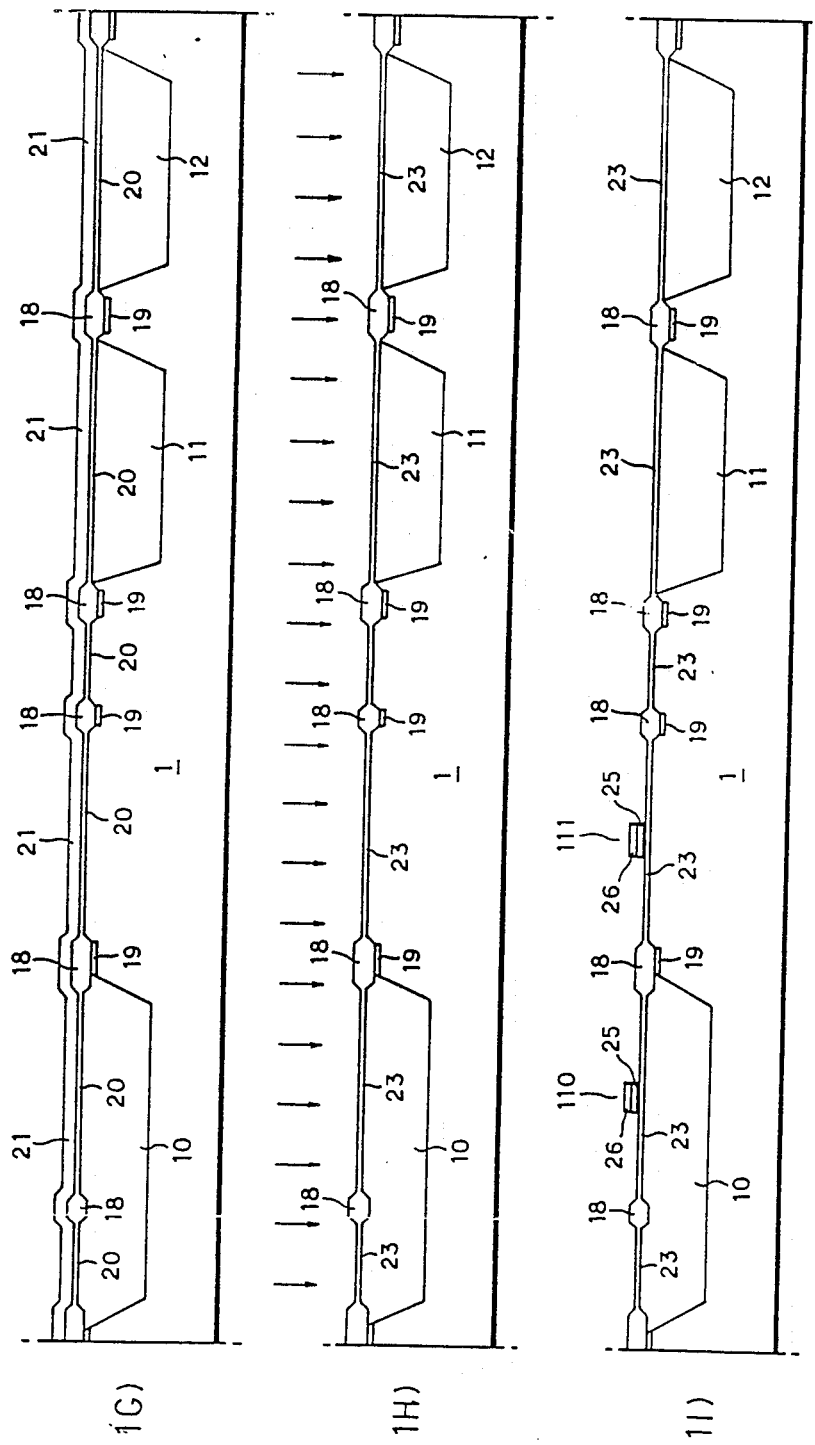
Figure 1:
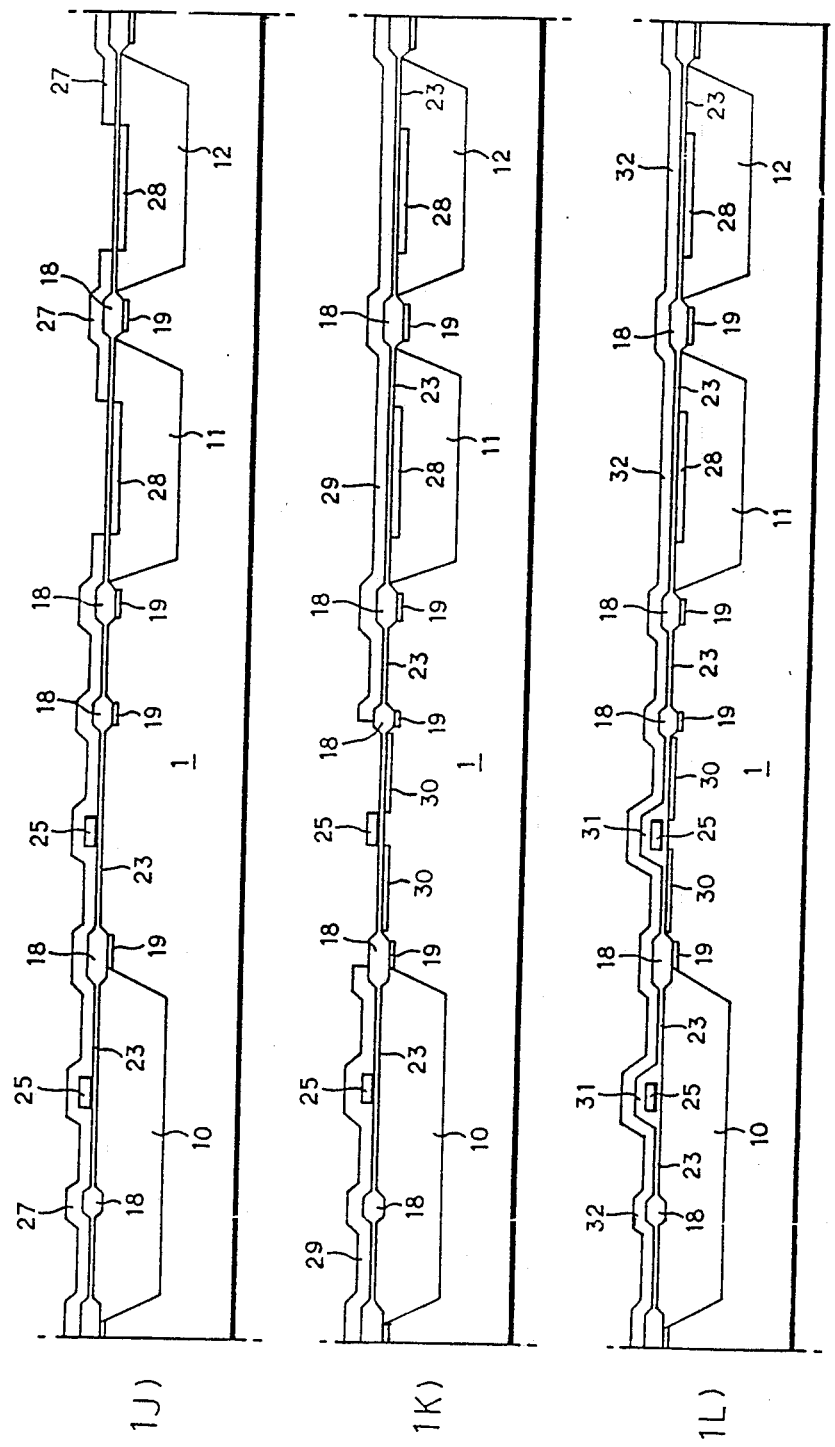
Figure 1:
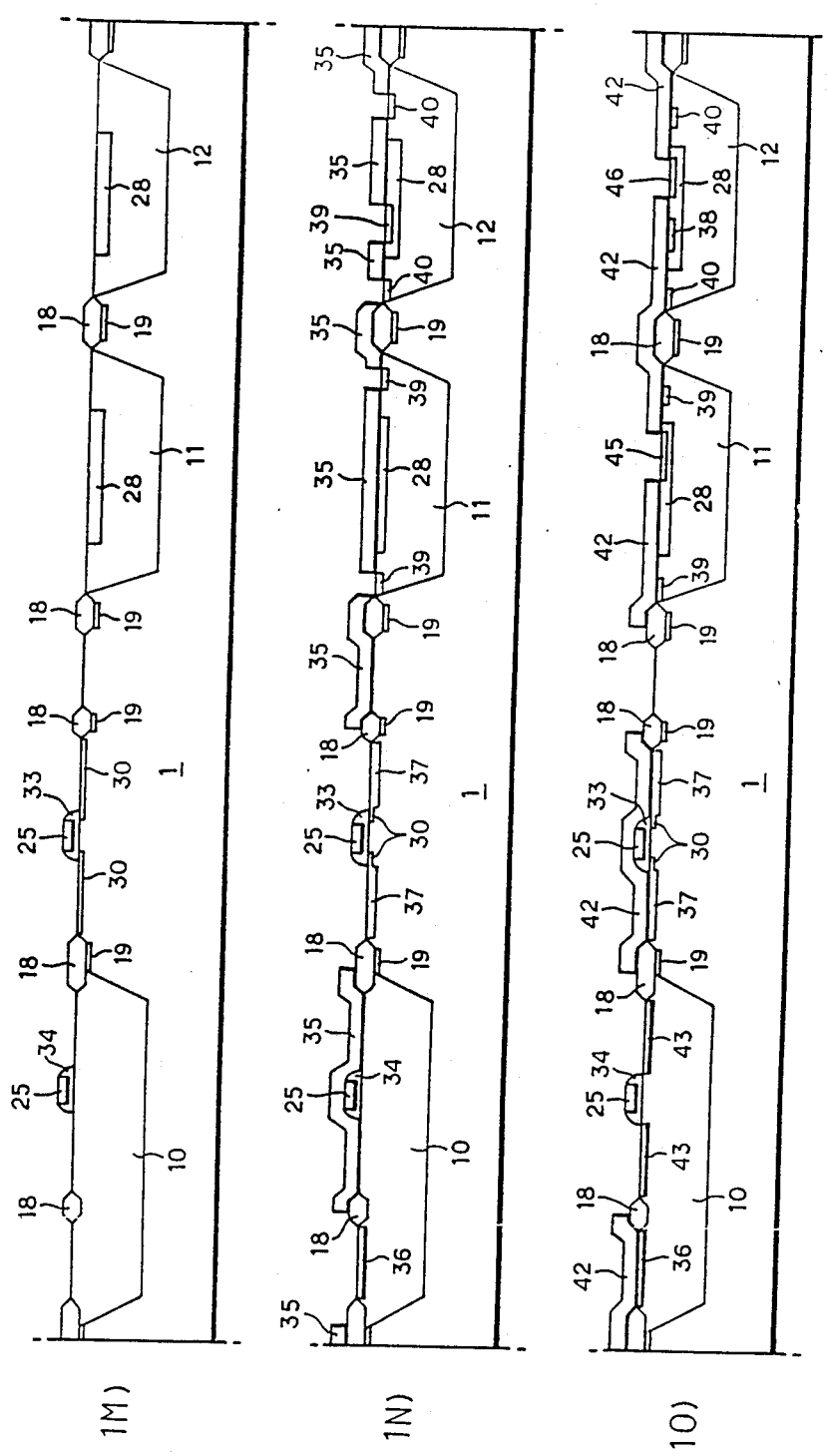
Figure 1:
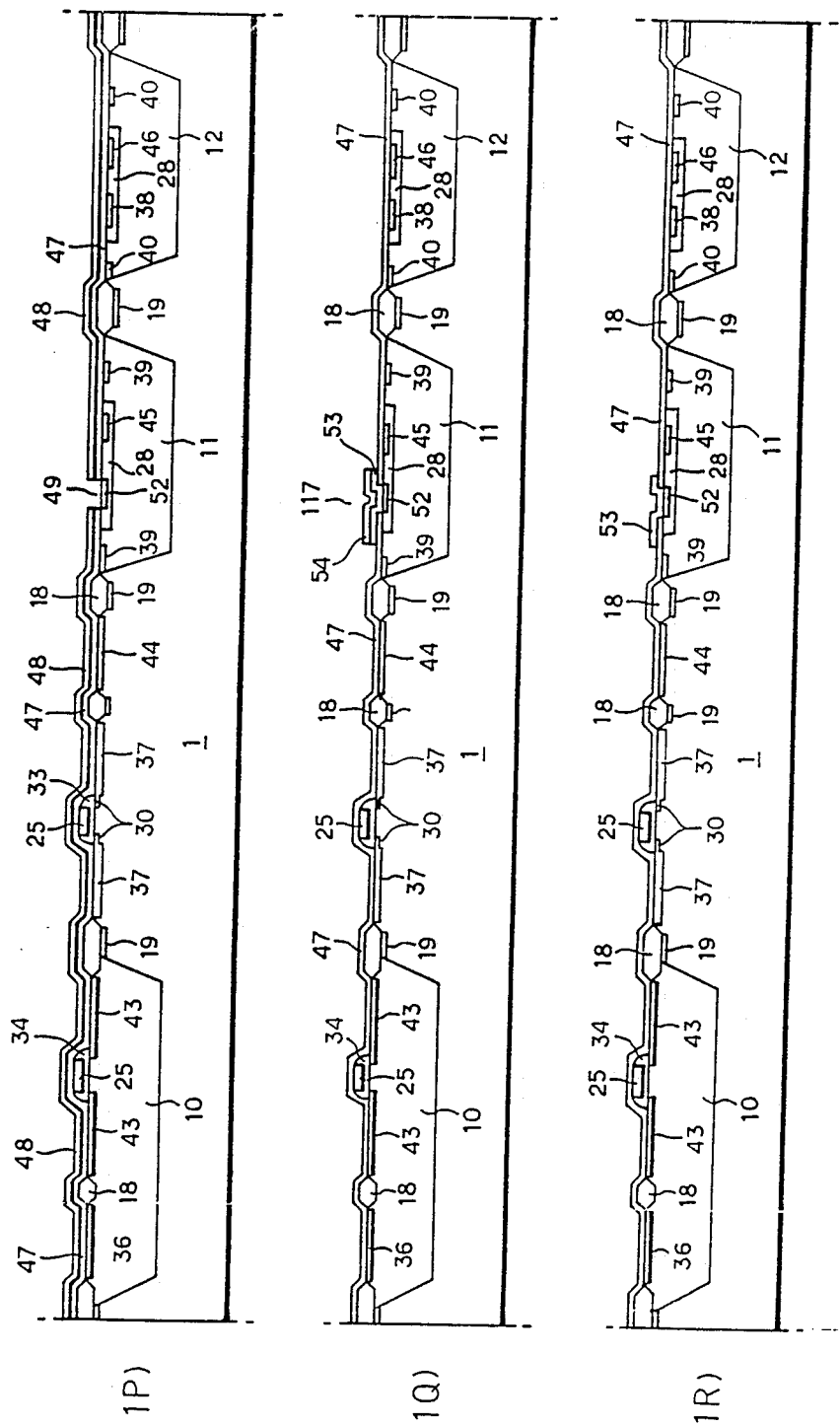
Figure 1:
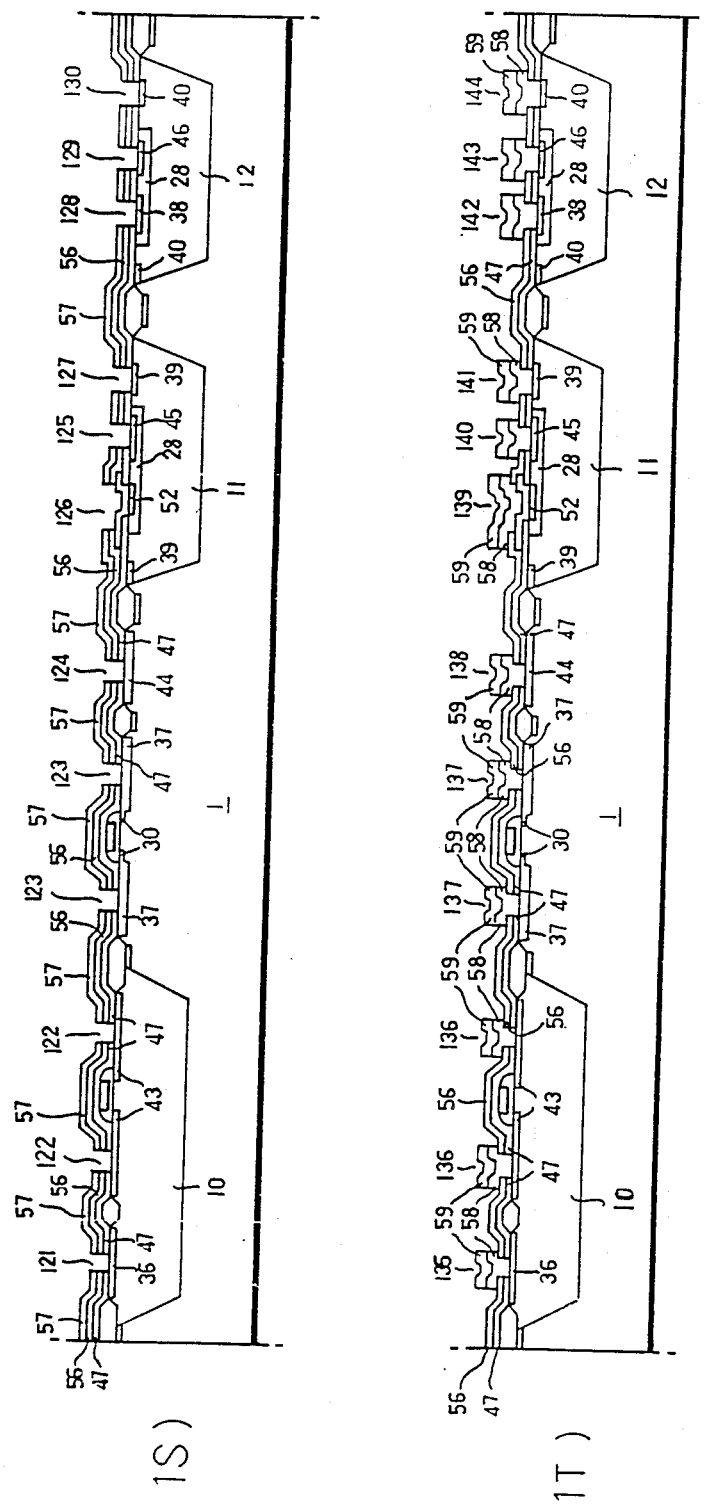
Figure 1:
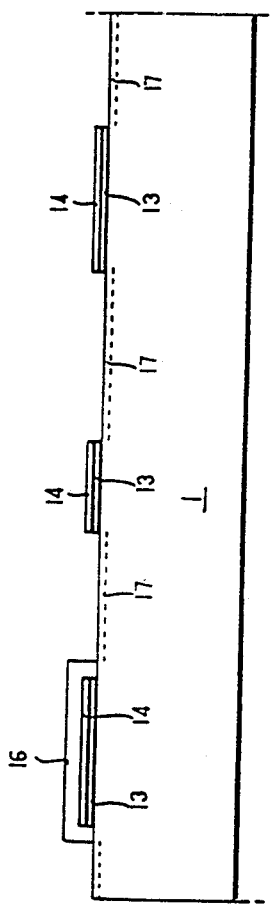
Figure 1:
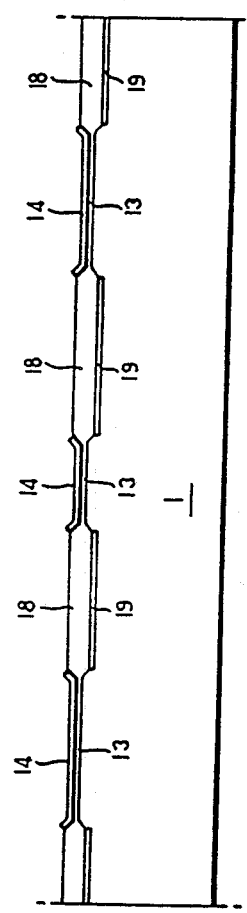
Figure 1:
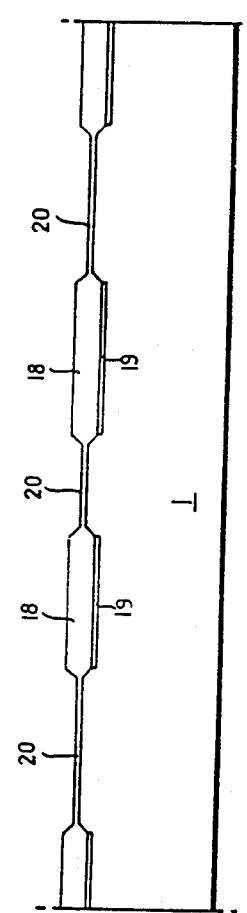
Figure 1:
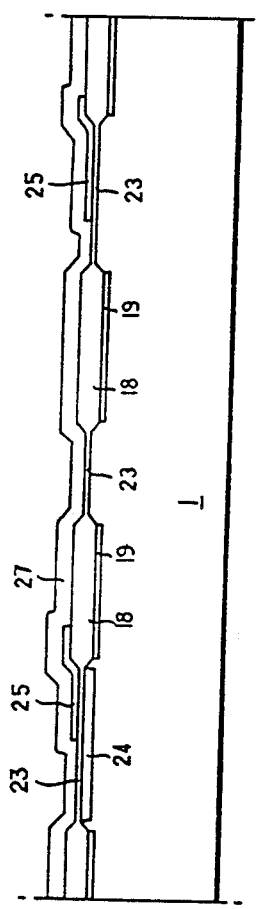
Figure 1:
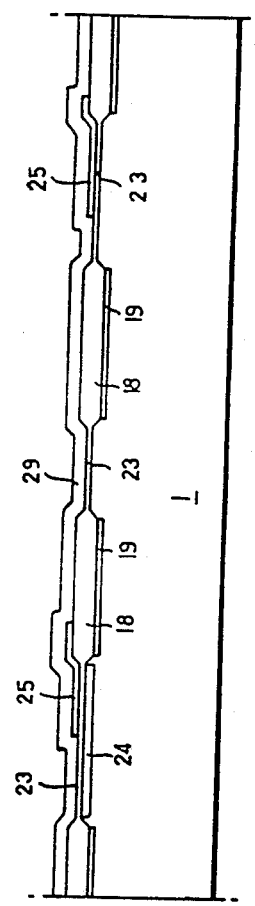
Figure 1:
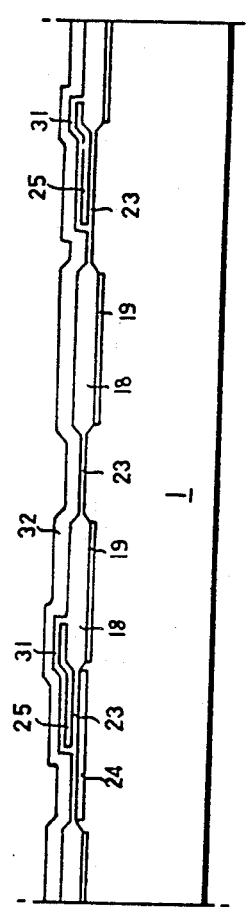
Figure 1:
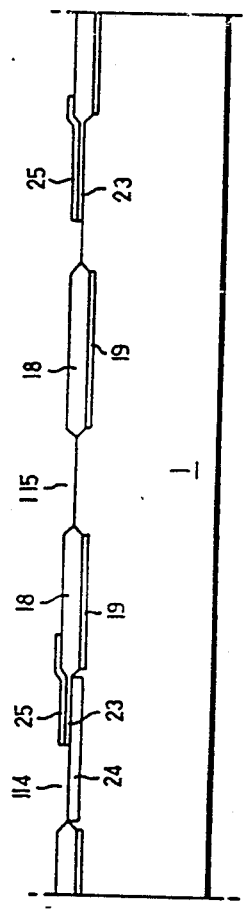
Figure 1:
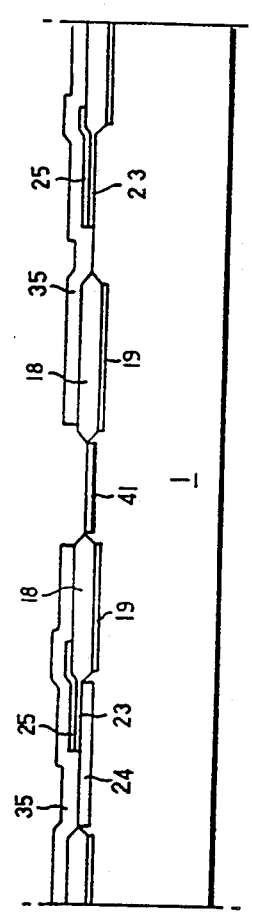
Figure 1:
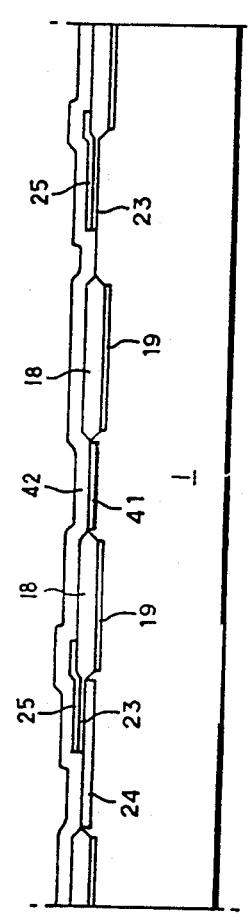
Figure 1:
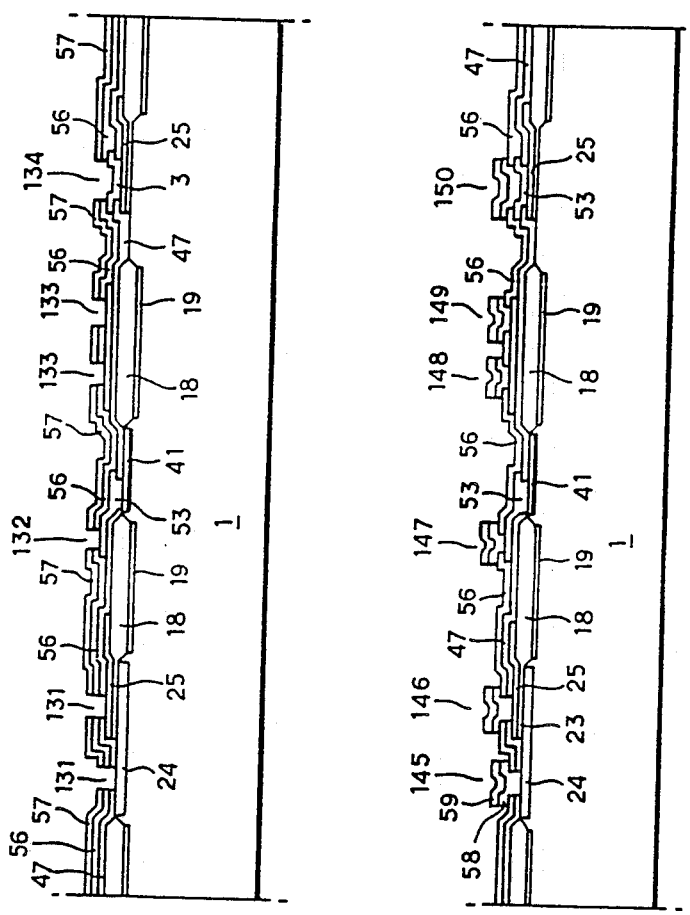

Hereinafter, a preferred embodiment of this invention will be described in detail with reference to the drawings. FIGS. 1(A) to 1(T) and FIGS. 1(A') to 1(T') are cross-sectional views sequentially illustrating the process steps for manufacturing a BiCMOS device according to this invention. It should be noted that each processing step through said FIGS. 1(A) to 1(T) and 1(A') to 1(T') illustrates a single successive process carried out on a single substrate, respectively in pairs.

Referring to FIGS. 1(A) and 1(A'), after coating a silicon oxide layer 2 for masking on the whole substrate surface of P-type single crystal silicon substrate 1 with $<100>$ orientation and resistivity of 2–20 $\Omega$.Cm by means of a conventional oxidation process, a first photoresist layer 3 is deposited on the oxide layer 2, and windows 4, 5 and 6 are made by a conventional photolithographic technique in order to form the substrate region (or well) of PMOS transistor and the collector regions of polycrystalline silicon emitter NPN transistor and of metal contact emitter NPN transistor. Then there are formed N-type ion-implanted regions 7, 8 and 9 by means of ion implantation of group V impurity such as phosphorus (P) with an energy of about 160 KeV and a dose of $10^{12}$–$10^{14}$ ions/cm$^2$. After that, as shown in FIGS. 1(B) and 1(B'), the photoresist 3 used as a mask in performing the ion implantation of group V impurity such as phosphorus is removed, and there are formed a N-type first substrate region 10, a N-type third substrate region 11 and a N-type fourth substrate region 12 having a depth of about 2.5 $\mu$m by means of activating and diffusing said N-type ion-implanted regions 7, 8 and 9 under the atmosphere of oxygen and nitrogen at a temperature between 1000° C. and 1200° C. The substrate region 1 between said first substrate region 10 and said third substrate region 11 may be a second substrate region so that a NMOS transistor will be formed in the subsequent process. Thereafter, upon removing all the oxide layer 2 on said substrate 1, an oxide layer 13 having the thickness of 500 Å is deposited on the surface of substrate 1, and a nitride layer 14 of Si$_3$N$_4$ having a thickness of 1500 Å is deposited on the oxide layer 13 by a conventional Low Pressure CVD (Chemical Vapor Deposition). The masking layer consisting of said oxide layer 13 and said nitride layer 14 is used to prevent the oxidation of silicon on the substrate surface 1 below said masking layer during the following oxidation process. A second photoresist 15 is coated on the masking layers 13, 14 by a conventional method. Photoresist 15 covers a connecting region 100 and a region 101 on the first substrate region 10 to be formed into a PMOS FET, a connecting region 103 and a region 102 on the second substrate region to be formed into a NMOS FET, regions 104 and 105 to be formed into NPN transistors, a MOS capacitor region 106, a resistor region 107 and a connecting region 108.

After etching the exposed nitride layer not covered with the mask in the nitride layer 14 shown in FIGS. 1(C) and 1(C') by means of employing the second photoresist 15 as an etching mask, said second photoresist is removed. In order to electrically isolate each of the elements, a third photoresist 16 is then deposited as shown in FIGS. 1(D) and 1(D'). After forming a P-type ion-implanted region 17 by performing ion implantation of a group III impurity such as boron with a low energy of about 30 KeV and a dose of $10^{12}-10^{14}$ ions/cm$^2$, the third photoresist 16 is removed, and then there is formed a second oxide layer 18 as shown in FIGS. 1(E) and 1(E'). In this oxidation process, an oxide layer is not grown on a silicon substrate below the masking layers 13, 14 but grown on a region of silicon substrate not protected by said masking layers 13, 14. In addition said ion-implanted region 17 is activated, as shown in FIGS. 1(E) and 1(E'), so that there is formed a high concentration P+ channel stopper 19 for preventing the channel between elements for forming thereon. After growing the second oxide layer 18 with the previous process, the nitride layer 14 is removed by a conventional etching method without a mask, and a sacrificial oxide layer 20 is formed through a process of thermal sacrificial oxidation to purify the substrate surface. Thereafter, a fourth photoresist 21 is deposited to form a MOS capacitor as a passive element as shown in FIGS. 1(G) and 1(G'). After forming a N-type ion implanted region 22 by means of performing ion implantation of a group V impurity such as Arsenic (As) in a dose of $10^{15}-10^{16}$ ions/cm$^2$ in the MOS capacitor region 109, the photoresist 21 is removed. Then, by etching the thin oxide layer 20 over the substrate without use of a mask by means of HF solution, the second oxide layer 18 becomes a new oxide layer which is etched in the thickness of said thin oxide layer 20, and the remaining part of the substrate thereon coated with said second oxide layer is exposed. Thereafter there is deposited an oxide layer 23 with a thickness of 200-500 Å on the exposed substrate for the formation of a gate oxide layer of the MOS element and the dielectric of a capacitor, as shown in FIGS. 1(H) and 1(H'), by a conventional thermal oxidation process. At this time, in the process shown in FIGS. 1(G) and 1(G'), the ion-implanted region 22 is activated to form an electrode region 24 for a MOS capacitor as shown in FIG. 1(H'). After that, in order to control the threshold voltages of NMOS and PMOS FET's, there is performed ion implantation of a group III impurity such as boron (B) with an energy of about 30 KeV and a dose of $10^{11}-10^{13}$ ions/cm$^2$ into the whole silicon substrate. After there is formed a first polycrystalline silicon layer 25, which is employed as gate electrode material and connecting element material of MOS transistors, and electrode plate material with a constant area over the dielectric of the capacitor, on the whole silicon substrate by a conventional method, the group V impurities such as Phosphorus(P) are injected to lower the resistance of said first polycrystalline silicon layer 25. For example, the sheet resistance of the first polycrystalline silicon is about 20 $\Omega/\square$ by way of POC13 at a temperature 900° C. Thereafter, as shown in FIGS. 1(I) and 1(I'), a fifth photoresist 26 is coated to leave a polycrystalline silicon layer region 110 over a gate of a PMOS FET, a polycrystalline silicon layer region 111 over a gate of a NMOS FET, a polycrystalline silicon layer 112 of an upper electrode plate region of the capacitor dielectric layer, and a polycrystalline silicon layer region of connecting elements, that is, a first polycrystalline silicon region 113 to be connected with a second polycrystalline silicon in the following process. After the removal of the polycrystalline silicon layer 25 by a conventional method, the fifth photoresist 26 is also removed. Then a sixth photoresist 27 is deposited to form a base region of a bipolar transistor as shown in FIGS. 1(J) and 1(J'), and there is formed a P-type active base region 28 to form a non-compensated emitter region by means of a ion implantation of group III impurity such as boron (B) with an energy of about 70 KeV and a dose of $1\times10^{12}-5\times10^{13}$ ions/cm$^2$. After removing the sixth photoresist 27 used as a masking layer, a thermal process is carried out in a conventional method in order to activate a group III impurity such as boron implanted into the base region. Then a seventh photoresist 29 for the Lightly Doped Drain (LDD) is coated on the silicon surface, as shown in FIGS. 1(K) and 1(K'). By way of ion implantation of a group V impurity such as phosphorus (P) into only source/drain region of NMOS FET, with a dose of $10^{12}-10^{14}$ ions/cm$^2$ and an energy of about 30 KeV, there is formed source and drain regions 30 of the LDD-type NMOS transistor. After forming said source/drain region of low concentration and removing the seventh photoresist 29, an oxide layer 31 with the thickness of 500 Å is deposited on the first polycrystalline silicon layer 25 by carrying out a conventional thermal oxidation process at a temperature 900° C. and an oxide layer 32 is deposited on the whole silicon surface by a conventional CVD method as shown in FIGS. 1(L) and (L'). Thereafter, by processing the oxide layer 31 deposited by said thermal oxidation process and the oxide layer 32 deposited by the CVD method through a conventional dry etching method, as shown in FIG. 1(M), oxide layer spacers 33,34 of side walls of gate electrodes of NMOS and PMOS transistors are formed and a connecting region 114 for a lower electrode of a MOS capacitor is also formed. Said oxide layer spacer 33 becomes a mask for an ion implantation process to form high-concentration drain and source regions of a NMOS transistor with the LDD structure in the following process, thereby achieving a NMOS transistor having a LDD structure.

An eighth photoresist 35 is then coated on the silicon surface as shown in FIGS. 1(N) and 1(N'). Consequently, there are formed a connecting region 36 of the first substrate region 10 of PMOS FET, a source/drain region 37 of a NMOS FET, an emitter region 38 of metal contact emitter NPN transistor, a collector connecting region 39 of the third substrate region 11 of polycrystalline silicon emitter NPN transistor, a collector connecting region 40 of the fourth substrate region 12 of metal contact emitter NPN transistor, and a lower region 41 of a resistor, by performing ion implantation of group V impurity such as Arsenic with an energy of 40-80 KeV and a dose of $10^{14}-10^{16}$ ions/cm$^2$. The eighth photoresist 35 is then removed.

In the preferred embodiment of this invention, the NPN transistor is formed after selectively performing the LDD ion implantation with the seventh photoresist 29, but in case that the base concentration of the NPN transistor is high enough not to be largely affected by the LDD ion implantation, the NPN transistor with LDD structure can be formed by performing the LDD ion implantation without depositing the seventh photoresist 29.

Referring to FIGS. 1(O) and 1(O'), a ninth photoresist 42 is deposited on the substrate surface, and the group III impurity such as Boron (B) with a dose of $10^{15}-10^{16}$ ions/cm$^2$ is implanted with a low energy of about 30 KeV. Then there are formed a source/drain region 43 of PMOS FET, a connecting region 44 of the substrate 1 of NMOS FET, a connecting region 45 of the base 28 of the polycrystalline silicon emitter bipolar NPN transistor and a connecting region 46 of the base 28 of the metal contact emitter NPN transistor, and ninth photoresist 42 is removed. After this processing, an oxide layer 47 is deposited on the whole substrate surface by a conventional CVD method, and the quality of said oxide layer is densificated by a conventional method. Thereafter, a tenth photoresist 48 is coated on said silicon oxide layer 47, windows are formed on an emitter region 49 of the polycrystalline silicon emitter NPN transistor, a butting contact 50 of a resistor region and a contacting region 51 of a first and second polycrystalline silicon are formed by a general photolithographic technique, and then the group V impurity such as Arsenic (As) with a dose of $10^{15}$–$10^{16}$ ions/cm$^2$ is ion-implanted with an energy of 40 KeV. Consequently, as shown in FIG. 1(P), there are formed an emitter region 52 of the polycrystalline silicon emitter NPN bipolar transistor, a butting contact region 50 of the high-concentration resistor portion (shown in FIG. 1(P')) adequate for ohmic contact, and a contacting portion 51 (shown in FIG. 1(P')) of a first and second polycrystalline silicon. After removing the tenth photoresist 48, there is formed a second polycrystalline silicon layer 53 on all silicon substrate surfaces by a conventional method, so that it can be used for electrode material of the polycrystalline silicon emitter, passive resistor elements made of the polycrystalline silicon and connecting material.

As shown in FIGS. 1(Q) and 1(Q'), an eleventh photoresist 54 is deposited so as to leave a polycrystalline silicon region 117, a butting contact region, a second polycrystalline silicon region 118 of the resistor element having the sheet resistance of Giga ohms per square (G$\Omega$/□) unit, a resistor element region 119 of several hundreds $\Omega$/□ utilizing the second polycrystalline silicon layer and a polycrystalline silicon layer of only the second polycrystalline silicon portion 120 to be connected with the first polycrystalline silicon. After removing the polycrystalline silicon layer by general photolithographic techniques, the eleventh photoresist 54 is removed by a conventional method.

Thereafter, a twelfth photoresist 55 is deposited, as shown in FIG. 1(R'), in order to selectively control the electric characteristics of a passive element which is made of polycrystalline silicon. Resistor region 118a having the G$\Omega$/□ resistance is masked for protection, and the group V impurity such as Arsenic (As) with a appropriate dose concentration is ion implanted into the butting contact portion, the connecting portion of first and second polycrystalline silicon and a polycrystalline silicon emitter region so as to obtain sheet resistance of several hundreds of $\Omega$/□. Then the twelfth photoresist 55 is removed by a conventional method. A conventional CVD oxide layer 56 is deposited on the whole silicon surface, and the activation of impurities implanted into said regions 43, 44, 45, 46, 36, 37, 38 and 52 and the cohesion of said oxide layer 56 are performed by thermal annealing process. As shown in FIGS. 1(S) and 1(S'), a thirteenth photoresist 57 is coated on the whole substrate. Then there are etched the connecting region window 121 of the first substrate region and the source/drain region window 122 in PMOS FET, the source/drain region window 123 and the connecting region window 124 of the second substrate 1 region in NMOS FET, the base connecting region window 125, the emitter connecting region window 126 and the collector connecting region window 127 in the polycrystalline emitter bipolar NPN transistor, the emitter connecting region window 128, the base connecting region window 129 and the collector connecting region window 130 in the metal contact emitter NPN transistor, and finally the first and second polycrystalline silicon contacts 131 to 134.

After removing said thirteenth photoresist 57, there is deposited a metal layer 58 by a conventional vacuum evaporation method, as shown in FIGS. 1(T) and 1(T'). Next, a fourteenth photoresist 59 is deposited and a metal layer 58 is etched. Consequently, there are formed a connecting electrode 135 of the first substrate region 10 and source/drain electrode 136 of PMOS FET, the source/drain electrode 137 and the second substrate connecting electrode 138 of NMOS FET, the emitter electrode 139 and the base electrode 140 and the third substrate collector electrode 141 of the polycrystalline silicon emitter bipolar NPN transistor, the emitter electrode 142, the base electrode 143 and the fourth substrate collector electrode 144 of the metal contact emitter bipolar transistor, electrodes 145,146 of the MOS capacitor, electrodes 147 to 149 of the resistor region having the order of some G$\Omega$/□ or several hundreds of $\Omega$/□, and an electrode 150 of the contacting region of the first and second polycrystalline silicon. Then the fourteenth photoresist 59 is removed by the conventional method. After removing the fourteenth phtoresist 59, there is coated a protecting layer 60 (shown in FIG. 2) to protect the semiconductor device. In the preferred embodiment for forming the emitter region of said polycrystalline silicon emitter NPN transistor, as shown in FIG. 1(P), there are formed the emitter region by means of ion-implantation, deposited the second polycrystalline silicon layer above the emitter region, performed the N-type ion implantation on the second polycrystalline silicon layer, formed the oxide layer over all the substrate, and then activated said ion-implanted impurties by the thermal process.

However, the emitter region of polycrystalline silicon emitter NPN transistor may be also formed as the following method. After the processing of FIG. 1(O), there are removed the mask layer on the substrate and formed the CVD oxide layer on the whole substrate. Then the impurities implanted by said process are activated and a window for forming the emitter region of the first NPN transistor is made. There is formed a connecting part for the second polycrystalline silicon layer on the emitter region with said window and thereon ion-implanted with the high concentration. Then, a CVD oxide layer is deposited on the whole substrate and the thermal process is performed, by which the impurities implanted into the second polycrystalline silicon layer are activated so that the emitter region of the N-type first bipolar transistor having high concentration can be formed toward the base region.

Figure 2:
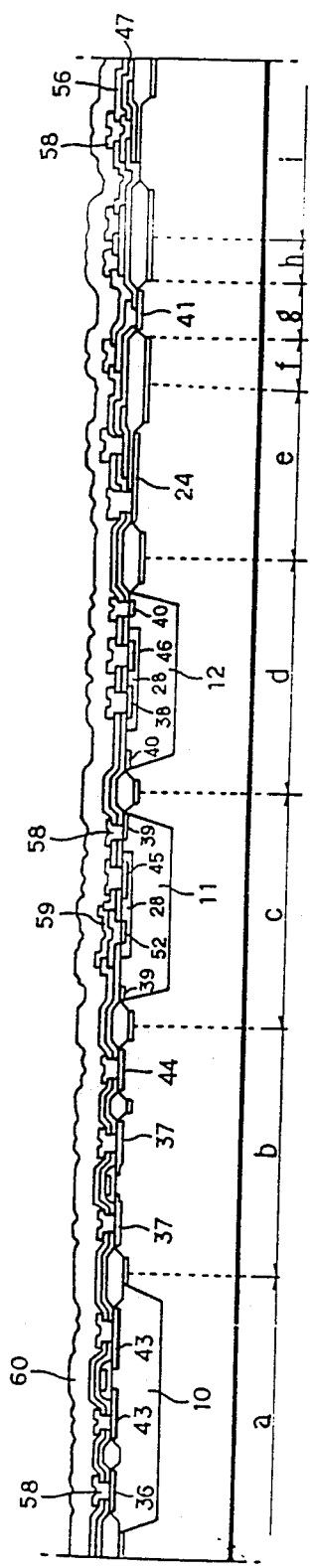
FIG. 2 is a final cross-sectional view of a device completely fabricated according to this invention.

FIG. 2 shows a final cross-sectional view of a complete BiCMOS device manufactured through said fabrication process according to the invention, wherein region 'a' is that of the PMOS transistor, region 'b' is of the NMOS transistor with LDD structure, region 'c' is of the polycrystalline silicon emitter NPN transistor, region 'd' is of the metal emitter NPN transistor, region 'e' is of the MOS capacitor, region 'f' is of the polycrystalline silicon resistor region having the resistance with the order of G$\Omega$/□, region 'g' is of the butting contact, region 'h' is of the polycrystalline silicon resistor with several hundreds of $\Omega$/□, and region 'i' is a contacting region connecting the first polycrystalline silicon layer with the second polycrystalline silicon layer.

Figure 3:
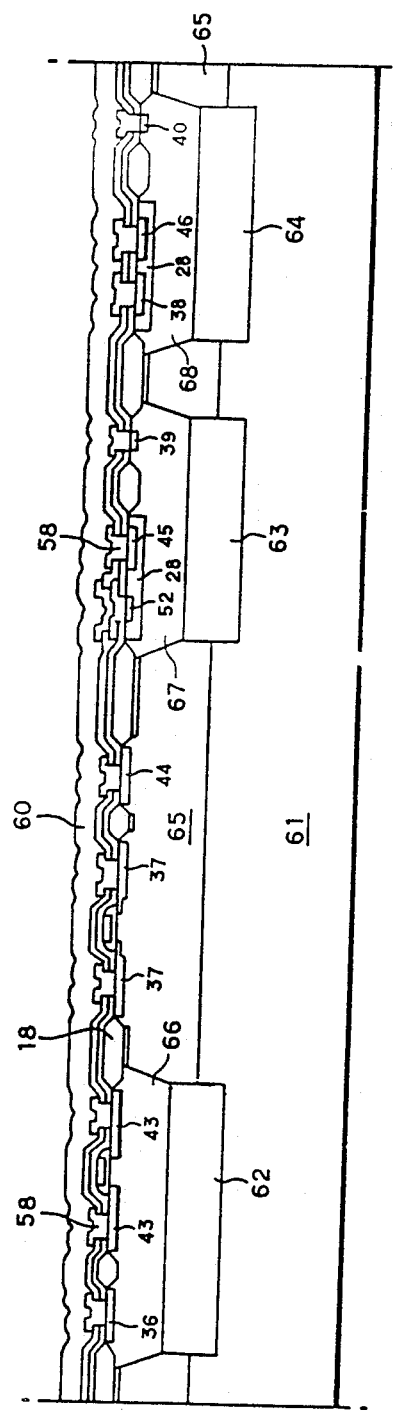
FIG. 3 is a final cross-sectional view of an active element portion in another preferred embodiment according to this invention.

FIG. 3 is a final cross-sectional view showing a portion of active elements in another preferred embodiment according to this invention. In the previous embodiment of FIGS. 1(A) to (T), the description of this invention is mainly made with respect to the triple diffusion structures thereof. However, it should be noted that this invention will be suitable for the formation of a BiCMOS structure having a standard bipolar transistor with the buried layer and the epitaxial layer as illustrated in FIG. 3. Referring to said BiCMOS structure, after forming a second conductivity type of buried layers 62, 63, 64 on a first conductivity type of single crystal silicon substrate 61 having low concentration, there is grown a first conductivity type of epitaxial layer 65 with high concentration on the whole substrate surface. Thereafter a first substrate region 66 forming a first MOS transistor with a first conductivity type of channel, and third and fourth substrate regions 67,68 making first and second bipolar transistors are respectively formed on the second conductivity type of buried layers 62, 63, 64. An epitaxial layer 65 between the first and third substrate regions 66,67 will be a second substrate region for forming a second MOS transistor. By sequentially performing the processes as shown in FIGS. 1(C) to 1(T), there can be manufactured a BiCMOS semiconductor device of FIG. 3 comprising a P-channel FET, a N-channel FET, a polycrystalline silicon emitter bipolar transistor and a metal contact emitter bipolar transistor. In practice, after a N+ buried layer above a P-type single crystal silicon substrate with the <100> orientation and the resistivity of 0.006–0.1 $\Omega \cdot Cm$ is formed, a P-type epitaxial layer with the resistivity of 5 $\Omega \cdot Cm$ is grown, and N-type first, third and fourth substrates are formed. Consequently, by sequentially carrying out the processes according to FIGS. 1(C) to 1(T), said BiCMOS device can be manufactured.

Figure 4:
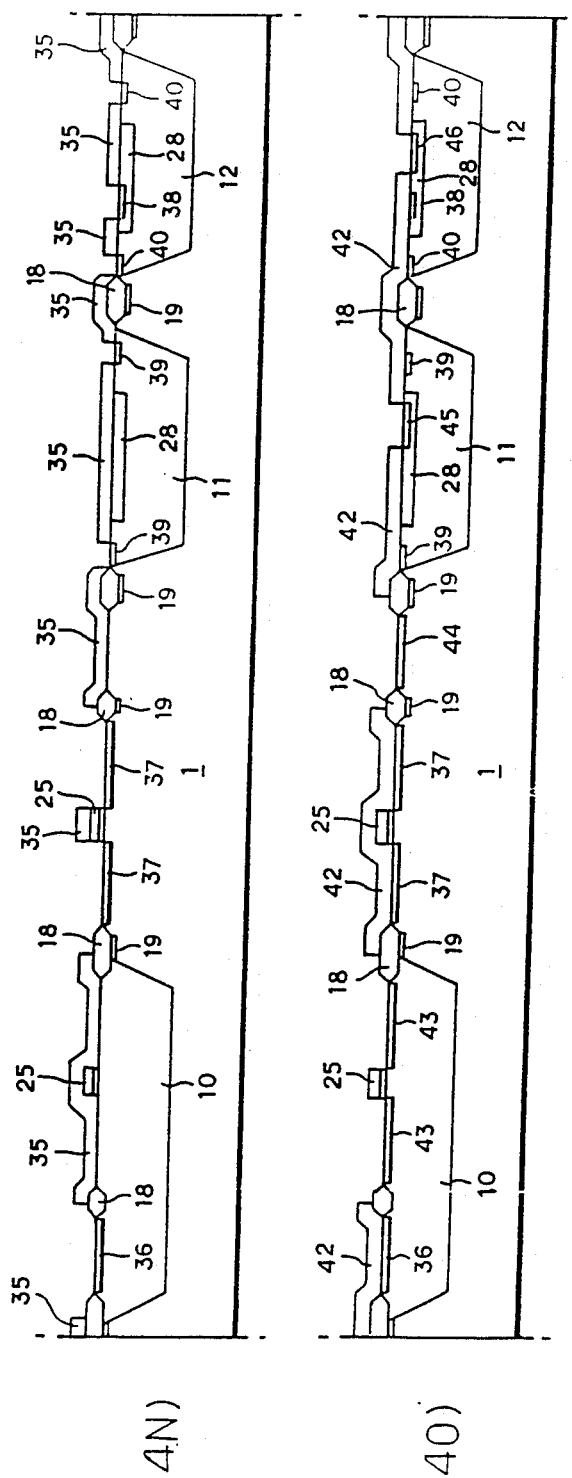
FIGS. 4(N) through 4(T) are cross-sectional views illustrating the process steps of another preferred embodiment according to this invention.
Figure 4:
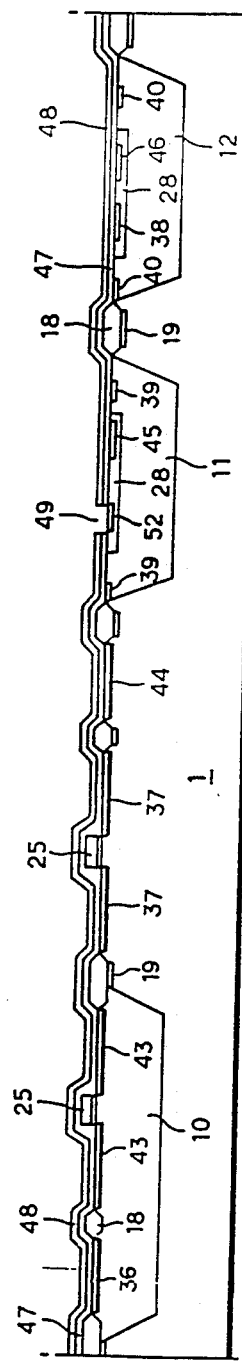
Figure 4:
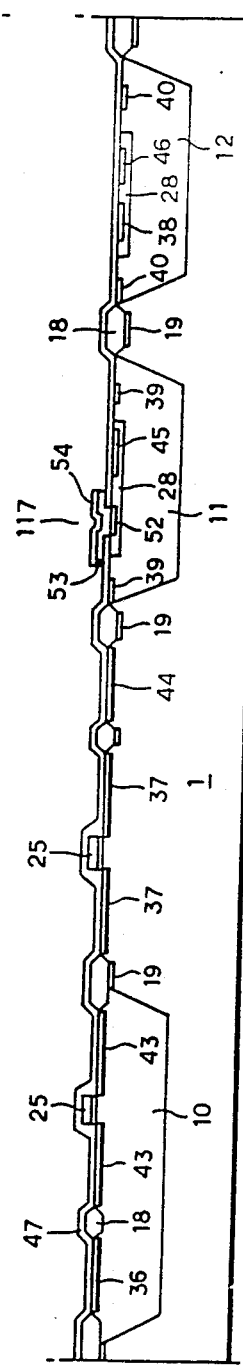
Figure 4:
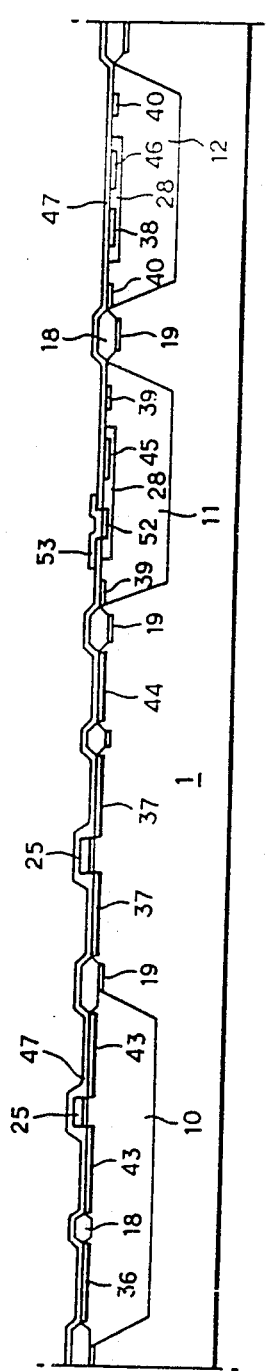
Figure 4:
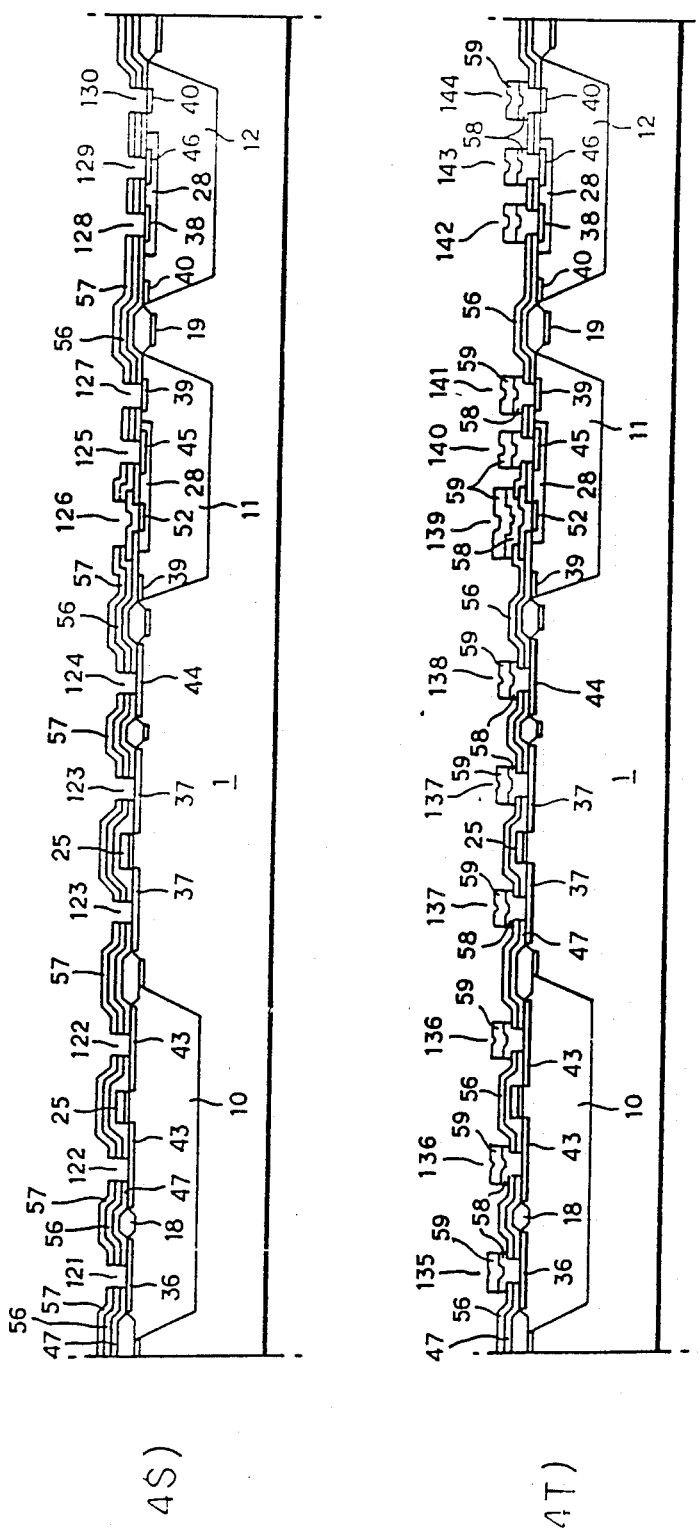
Figure 1:
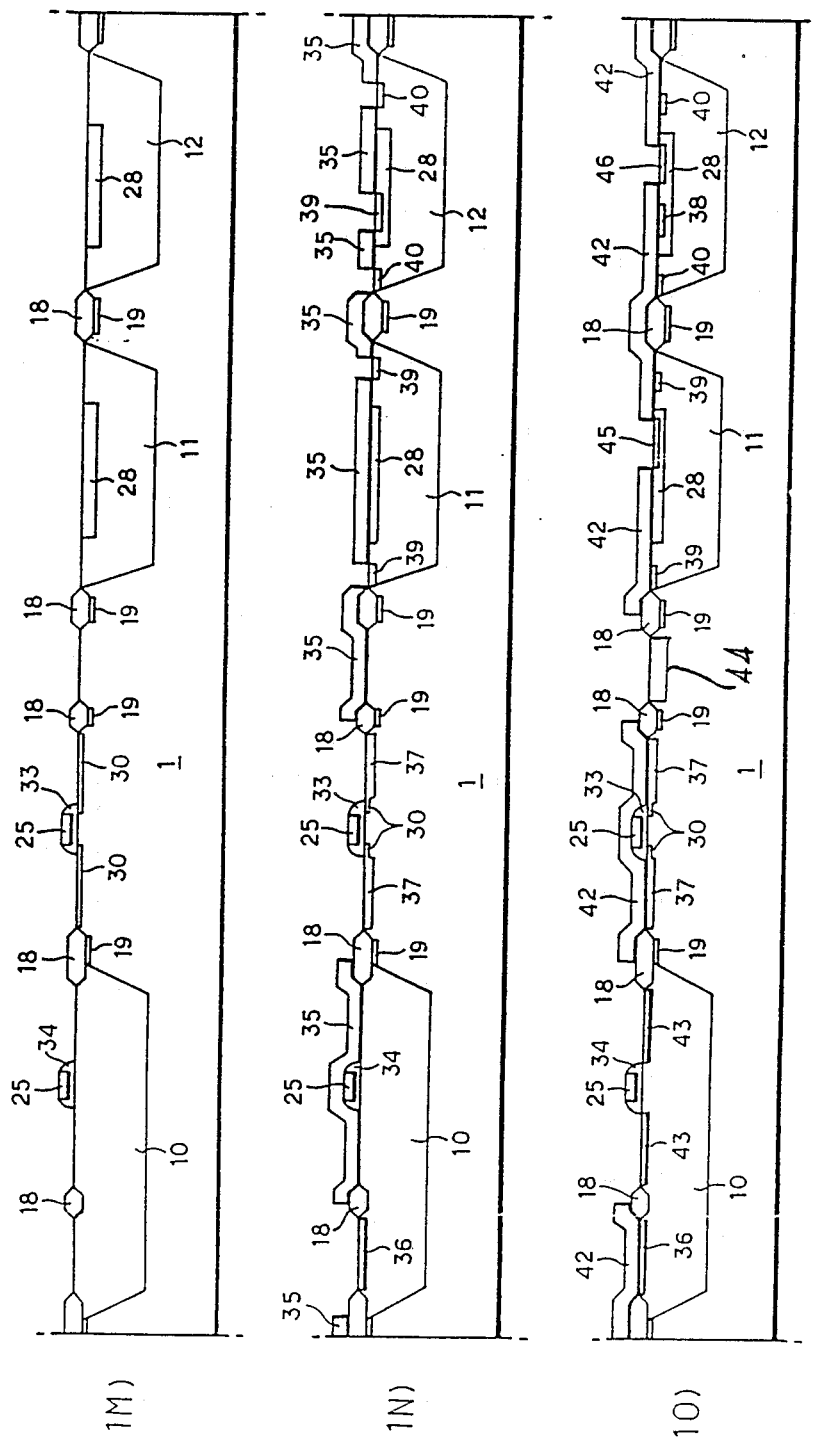

Referring to FIG. 4, showing each fabrication step in an another preferred embodiment according to this invention, the processes identical to those of FIGS. 1(A) to 1(J) are performed on the substrate in which the P-type epitaxial layer of high concentration is deposited on the P-type single crystal silicon substrate as shown in FIG. 1 or on the P-type single crystal silicon layer of low concentration as shown in FIG. 3. Thereafter the remaining photoresist 27 above said substrate and the oxide layer 23 above regions for forming elements are removed. As shown in FIG. 4(N), the eighth photoresist 35 is deposited on the silicon substrate surface and the group V impurity such as Arsenic (As) with the dose of $10^{14}$–$10^{16}$ ions/cm$^2$ is implanted with an energy of 40–80 KeV. Then there are formed a connecting region 36 of the first substrate region 10 of PMOS transistor, a source/drain region 37 of the second substrate region of a NMOS transistor, an emitter region 38 of the metal contact emitter NPN transistor, a collector connecting region 39 of the third substrate region 11 of the polycrystalline silicon emitter NPN transistor, a collector connecting region 40 of the fourth substrate region 12 of the metal contact emitter NPN transistor and a lower region 41 of the resistor which is not illustrated in FIG. 4. Thus the eighth photoresist 35 is removed. The subsequent processes from the process of FIG. 4(O) are identical to the corresponding ones of FIGS. 1(O) to 1(T), respectively. In FIGS. 4(N) to 4(T) and FIGS. 1(N) to 1(T), the same reference numerals are used to represent the same elements and regions in the same fabrication process. Said FIGS. 4(N) to 4(T) show a portion of active elements of the BiCMOS transistor of this invention, and a portion of the passive elements thereof, which is not illustrated therein, can be formed as shown in FIGS. 1(A') to 1(T') by the aforementioned processes. The BiCMOS device manufactured through said processes becomes a BiCMOS device consisting of a conventional NMOS transistor instead of the NMOS transistor with LDD structure, being different from the preferred embodiment illustrated in FIG. 3.

As described hereinbefore, the invention achieves high-integration, high-performance MOS transistors in a BiCMOS semiconductor device, and further achieves high-performance, high-precision bipolar transistors having a good matching characteristic together with the formation of said NMOS transistor, thereby enabling use in a precision analog circuit. Also it will be noted that the invention is well arranged for the polycrystalline silicon emitter NPN transistor having a small area of emitter which is particularly suitable for high-speed digital devices and the metal contact emitter NPN transistor which is specially fit for precise analog circuit and high-load driving power. Furthermore, the invention optimally integrates the high quality MOS capacitor particularly necessary for an analog MOS circuit and the polycrystalline silicon resistor for the bias and load in various circuits, and achieves more convenient inter-connections between the elements. Accordingly, there will be optimally achieved a high-performance digital VLSI circuit such as a logic circuit, a memory, etc. or an analog VLSI circuit such as a data converter, a switched capacitor circuit, etc. or the composite circuit of the two, which has been relatively difficult to achieve by means of the prior art.

While the invention has been described with reference to the illustrative embodiments, this description is not intended to be construed in a limiting sense. Various modifications of the illustrative embodiments, as well as other embodiments of the invention, will be apparent to persons skilled in the art upon reference this description, without departing from the spirit of the invention.

What is claimed is:

1. A method of making a BiCMOS semiconductor device including a first and a second MOSFETs, and a first and a second bipolar transistor on a first conductivity-type silicon substrate, said method comprising the steps of:

(a) performing on a first conductivity-type silicon substrate, a second conductivity-type of ion-implantation for producing a first substrate region to thereon form first and second bipolar transistors respectively on said substrate, wherein a second MOSFET transistor may be subsequently formed in a second substrate region being located between the first and third substrate regions, and then activating said substrate regions;

(b) forming a first oxide layer between said substrate regions for isolating said respective transistors on said substrate and forming a first conductivity-type of channel stopper region below said first oxide layer;

(c) growing a second oxide layer on a whole substrate surface of said substrate for forming each gate oxide layer of said first and second MOSFET transistors;

(d) depositing a first polycrystalline layer on said second oxide layer, doping with the second conductivity-type into the whole surface of the first polycrystalline layer, and etching the first polycrystalline layer so as to produce each gate of said first and second MOSFET transistors on the first and the second substrate regions, respectively;

(e) ion-implanting with a first conductivity-type, for forming each base region of said first and second bipolar transistors on said third and fourth substrate regions, and then activating said base regions;

(f) ion-implanting with a second conductivity-type for forming each first source and drain region of said second MOSFET transistor on a second substrate region to thereon form said second MOSFET transistor on said substrate;

(g) sequentially growing third and fourth oxide layers on said substrate surface;

(h) forming an oxide spacer on gate sidewalls of the MOSFET transistors on said first and second substrate regions through etching said third and fourth oxide layers without a separate mask;

(i) performing a fourth ion-implanting step with a second conductivity-type for forming a connecting region of the first substrate regions, collector connecting regions of the third and fourth substrate regions, an emitter region of the second bipolar transistor, and second drain and source regions of the second MOSFET transistor;

(j) performing a fifth ion-implanting step with a first conductivity-type for forming drain and source regions of the first MOSFET transistors of the first substrate region, a connecting region of the second MOSFET transistor of the second substrate region, a base connection region of the first bipolar transistor of the third substrate region and a base connecting region of the second bipolar transistor of the fourth substrate region;

(k) activating impurities ion-implanted by said fourth and fifth ion-implanting steps, growing a fifth oxide layer on the whole substrate surface, and performing a process for raising the density of the fifth oxide layer;

(l) forming a window for producing an emitter region of the first bipolar transistor on the third substrate region and ion-implanting with a second conductivity type through said window;

(m) depositing a second polycrystalline layer on the whole of the substrate and etching said second polycrystalline layer to produce a connecting portion for a polycrystalline emitter region of the first bipolar transistor on the third substrate region;

(n) performing a seventh ion-implanting step with a second conductivity-type into the second polycrystalline of an emitter connecting region of the first bipolar transistor, growing a sixth oxide layer on the whole substrate surface, and then performing a process for activation of impurities ion-implanted by said seventh ion-implanting step and a thermal process for raising the density of the sixth oxide layer;

(o) forming windows for each source and drain region for the first and second MOSFET transistors, each emitter, base and collector region of the first and second bipolar transistors and each connecting region of the substrate regions of the first and second MOSFET transistors, respectively;

(p) connecting a plurality of said regions to a conductive layer through said windows; and (q) depositing a protecting layer on the whole substrate surface and then exposing a pad for wire-welding.

2. A method according to claim 1, further comprising the steps of:

forming the first oxide layer between said respective substrate regions with the exception of a region to thereon form a capacitor region, and the first conductivity-type of channel stopper region below the first oxide layer in said first oxide layer formation step;

ion-implanting for forming a lower electrode of a capacitor in the capacitor after forming said first oxide layer;

forming an oxide dielectric layer over the lower electrode of the capacitor in addition to forming the gate oxide layers of the first and the second MOSFET transistors while growing said second oxide layer;

forming an upper electrode of the capacitor in addition to forming the polycrystalline gates of the first and the second MOSFET transistors in said step of deposition said first polycrystalline layer;

forming a connecting region for the lower electrode of the capacitor in addition to forming the oxide spacer of gate sidewalls of the first and the second MOSFET transistors in said step of forming the oxide spacer;

forming a connecting window for the capacitor region; and connecting said capacitor region to the conductive layer through said connecting window.

3. A method according to claim 1, further comprising the steps of:

forming the first oxide layer between said respective substrate regions and a resistor region with the exception of a region to form a substrate connecting region of a resistor region, and the first conductivity-type of channel stopper region below the first oxide layer in said first oxide layer formation step;

forming an ion-implanting region under the substrate connecting region of said resistor while performing said fourth ion-implanting step;

ion-implanting after forming a connecting window of a butting contact portion of the resistor region while forming said window for producing said window of the emitter region of the first bipolar transistor;

forming a high resistance portion, a butting contact portion and a low resistance portion of the resistor region while etching said second polycrystalline layer;

ion-implanting with a second conductivity-type into the butting contact portion and the low resistance portion of the resistor region during said seventh ion-implanting step;

forming a connecting window for the resistor region while forming said windows for each said source and drain region; and connecting the resistor region to the conductive layer through said windows.

4. A method according to claim 3, further comprising the steps of:

forming the first oxide layer between said regions with the exception of the regions to form a capacitor region and the substrate connecting region of the resistor, and the first conductivity-type of said channel stopper region below the first oxide layer in said first oxide layer formation step;

performing an ion-implantation step to produce a lower electrode of a capacitor on said capacitor region after forming said first oxide layer;

growing an oxide dielectric layer over the lower electrode of the capacitor while growing said second oxide layer;

forming an upper electrode of said capacitor while forming the polycrystalline gate of the first and second MOSFET transistors;

forming the lower electrode connecting region of said capacitor and the substrate connecting region of the resistor while forming the oxide spacer;

forming connecting windows for the resistor and the capacitor regions; and connecting said resistor and capacitor regions to the conductive layer through said windows.

5. The method according to claim 1, further comprising:

forming on said first conductivity-type silicon substrate, the second conductivity-type of buried layer for each of said first, third and fourth substrate regions; and then producing said first, third and fourth substrate regions in correspondence with respective ones of said buried regions.

6. The method according to claim 5, further comprised of growing a first conductivity-type of epitaxial layer on the substrate surface to define said second substrate region, before forming said first oxide layer.

7. A method of making a BiCMOS semiconductor device including a first and a second MOSFET and a first and a second bipolar transistor on a first conductivity-type silicon substrate, said method comprising the steps of:

(a) on a first conductivity-type silicon substrate performing a second conductivity-type of ion-implantation for producing a first substrate region to thereon form a first MOSFET transistor, and a third and a fourth substrate region to thereon form first and second bipolar transistors respectively on said substrate, and subsequently forming a second MOSFET in a second substrate region located between the first and third substrate region, and then activating said ion-implanted substrate regions;

(b) forming a first oxide layer between said substrate regions for isolating said respective transistors on said substrate and forming a first conductivity-type of channel stopper region below said first oxide layer;

(c) growing a second oxide layer on the exposed surface of said substrate for forming each gate oxide layer of said first and second MOSFETs;

(d) depositing a first polycrystalline layer on said second oxide layer, doping with the second conductivity-type into the whole surface of the first polycrystalline layer, and then etching the first polycrystalline layer so as to produce each gate of said first and second MOSFETs on the first and the second substrate regions, respectively;

(e) performing a second ion-implanting step with a first conductivity-type, for forming each base region of said first and second bipolar transistors on said third and fourth substrate regions, and then activating said ion-implanted base regions;

(f) performing a third ion-implanting step with the second conductivity-type for forming a connecting region of the first substrate region, collector connecting regions for each of the third and the fourth substrate regions, and emitter region of the second bipolar transistor, and drain and source regions of the second MOSFET;

(g) performing a fourth ion-implanting step with the first conductivity-type for forming drain and source regions for the first MOSFET of the first substrate region, a connecting region of the second MOSFET transistor of the second substrate region, a base connecting region of the first bipolar transistor of the third substrate region and a base connecting region of the second bipolar transistor of the fourth substrate region;

(h) activating impurities ion-implanted by said third and fourth ion-implanting steps, growing a third oxide layer on the whole substrate surface, and performing a process for raising the density of the third oxide layer;

(i) forming a window for producing an emitter region of the first bipolar transistor on the third substrate region and ionimplanting with the second conductivity-type through said window;

(j) depositing a second polycrystalline layer on the whole substrate and etching the second polycrystalline layer to produce a connecting portion for a polycrystalline emitter region of the first bipolar transistor on the third substrate region;

(k) performing a sixth ion-implanting step with the second conductivity-type into the second polycrystalline layer of an emitter connecting region for the first bipolar transistor, growing a fourth oxide layer on the whole substrate surface, and then performing a step for activation of impurities ion implanted by said sixth ion-implanting step and a thermal process for raising the density of the fourth oxide layer;

(l) forming windows for each source and drain region of the first and second MOSFETs, each emitter, base and collector regions of the first and second bipolar transistors and each connecting region of the substrate regions of the first and second MOSFETs, respectively;

(m) connecting a plurality of said connecting and collector regions to a conductive layer through said windows; and (n) depositing a protecting layer on the whole substrate surface and then exposing a pad for wire-welding.

8. A method according to claim 7, further comprising the steps of:

forming the first oxide layer between said respective substrate regions with the exception of a region to thereon form a capacitor region, and the first conductivity-type of channel stopper region below the first oxide layer in said first oxide layer formation step;

ion-implanting for forming a lower electrode of a capacitor in the capacitor region after forming said first oxide layer;

forming an oxide dielectric layer over the lower electrode of the capacitor in addition to forming the gate oxide layers of the first and the second MOSFETs while growing said second gate oxide layer;

forming an upper electrode of the capacitor in addition to forming the polycrystalline gates of the first and the second MOSFETs in said step of depositing said first polycrystalline layer forming a connecting region for the lower electrode of the capacitor after said second ion-implanting step;
forming a connecting window for the capacitor region; and
connecting said capacitor region to the conductive layer through said connecting window.

9. A method according to claim 7, further comprising the steps of:
forming the first oxide layer between said respective substrate regions and a resistor region with the exception of a region to form a substrate connecting region of a resistor region, and the first conductivity-type of channel stopper region below the first oxide layer in said first oxide layer formation step;
forming the substrate connecting region of the transistor region after said second ion-implantation step;
forming an ion-implanting region under the substrate connecting region of said resistor region while performing said third ion-implanting step;
ion-implanting after forming a connecting window of a butting contact portion of the resistor region while forming said window for the emitter region of the first bipolar transistor;
forming a connecting window for the resistor region while forming said windows for each said source and drain region; and
connecting the resistor region to the conductive layer through said windows.

10. A method according to claim 9, further comprising the steps for:
forming the first oxide layer between said regions with the exception of the regions to form a capacitor region and the substrate connecting region of the resistor region, and the first conductivity-type of channel stopper region below the first oxide layer formation step;
performing an ion-implantation step to produce a lower electrode of a capacitor on said capacitor region after forming said first oxide layer;
growing an oxide dielectric layer over the lower electrode of the capacitor while growing said second oxide layer;
forming the upper electrode of said capacitor while forming the gates of the first an second MOSFET transistors;
forming the lower electrode connecting region of said capacitor region and the substrate connecting region of the resistor region after performing said second on-implanting step; and
forming connecting windows for the capacitor region.

11. A method of making a BiCMOS semiconductor device including a first and a second MOSFETs, and a first and a second bipolar transistors on a first conductivity-type silicon substrate, said method comprising the steps of:
(a) performing on a first conductivity-type substrate, a second conductivity-type of ion-implantation for producing a first substrate region to thereon form a first MOSFET, and a third and a fourth substrate region to thereon form first and second bipolar transistors respectively on said substrate, wherein a second MOSFET is subsequently formed in a second substrate region located between the first and third substrate regions, and then activating said substrate;
(b) forming a first oxide layer between said substrate regions for isolating said respective transistors on said substrate and forming a first conductivity-type of channel stopper region below said first oxide layer;
(c) growing a second oxide layer on the exposed surface of the substrate for forming each gate oxide layer of said first and second MOSFETs;
(d) depositing a first polycrystalline layer on said second oxide layer, doping with the second conductivity-type into the whole surface of the first polycrystalline layer, and then etching the first polycrystalline layer so as to produce each gate of said first and second MOSFETs on the first and the second substrate regions, respectively;
(e) performing a second ion-implanting step with a first conductivity-type, for forming each base region of said first and second bipolar transistors on said third and fourth substrate regions, and then activating said ion implanted base regions;
(f) performing a third ion-implanting step with a second conductivity-type for forming first source and drain regions of said second MOSFET on a second substrate region to thereon form said second MOSFET on said substrate;
(g) sequentially growing third and fourth oxide layers on the exposed substrate surface;
(h) forming an oxide spacer on gate sidewalls of the MOSFETs on said first and second substrate regions through etching said third and fourth oxide layers without a separate mask;
(i) performing a fourth ion-implanting step with a second conductivity-type for forming a connecting region of the first substrate region, collector connecting regions of the third and fourth substrate regions, an emitter region of the second bipolar transistor, and second drain and source regions of the second MOSFET;
(j) performing a fifth ion-implanting step with a first conductivity-type for forming drain and source regions of the first MOSFET of the first substrate region, connecting regions of the second MOSFET of the second substrate region, a base connecting region of the first bipolar transistor of the third substrate region and a base connecting region of the second bipolar transistor of the fourth substrate region;
(k) growing a fifth oxide layer on the exposed surface of the substrate, performing a thermal process for the activation of the impurities ion-implanted by said fourth and fifth ion-implanting processes, raising the density of the fifth oxide layer surface, and then forming an emitter connecting region window of the first bipolar transistor;
(l) depositing a second polycrystalline layer on the exposed surface of the substrate and etching said second polycrystalline layer to produce a connecting portion for a polycrystalline emitter region of the first bipolar transistor on the third substrate region;
(m) performing a sixth ion-implanting step with a second conductivity-type of ion-implantation into the second polycrystalline of an emitter connecting region of the first bipolar transistor, growing a sixth oxide layer on the exposed surface of the substrate, forming an emitter region of the first bipolar transistor through the activation of impurities ion-implanted in said sixth ion-implanting step, and then performing a thermal process for raising the density of the sixth oxide layer;

(n) forming windows for each source and drain region of the first and second MOSFETs, each emitter, base and collector region of the first and second bipolar transistors and each connecting region of the substrate regions and the first and second MOSFETs, respectively;

(o) connecting a plurality of said regions to a conductive layer through said windows; and (p) depositing a protecting layer on the whole substrate surface and then exposing a pad for wire-welding.

12. A method according to claim 11, further comprising the steps of:

forming the first oxide layer between said respective substrate regions with the exception of a region to thereon form a capacitor region, and the first conductivity-type of channel stopper region below the first oxide layer in said first oxide layer formation step;

ion-implanting for forming a lower electrode of a capacitor in the capacitor region after forming said first oxide layer;

forming an oxide dielectric layer over the lower electrode of the capacitor in addition to forming the gate oxide layers of the first and the second MOSFETs while growing said second oxide layer;

forming an upper electrode of the capacitor in addition to forming the polycrystalline gates of the first and the second MOSFETs in said step of depositing said first polycrystalline layer;

forming a connecting region for the lower electrode of the capacitor in addition to forming the oxide spacer on gate sidewalls of the first and the second MOSFETs in said step of forming the oxide spacer;

forming a connecting window for the capacitor region; and connecting said capacitor region to the conductive layer through said connecting window.

13. A method according to claim 11, further comprising the steps of:

forming the first oxide layer between said respective substrate regions and a resistor region with the exception of a region to form a substrate connecting region of the resistor region, and the first conductivity-type of channel stopper region below the first oxide layer in said first oxide layer formation step;

forming the substrate connecting region of the resistor while forming said oxide spacer;

forming an ion-implanting region under the substrate connecting region of said resistor and forming a connecting window of a butting contact portion of the resistor region while performing said fourth ion-implanting step;

forming a high resistance portion, a butting contact portion and a low resistance portion of the resistor region while producing said connecting portion for the emitter region of the first bipolar transistor;

ion-implanting with a second conductivity-type into the butting contact portion and the low resistance portion of the resistor region while etching said second polycrystalline layer;

forming a connecting window for the resistor region; and connecting the resistor region to the conductive layer through said window.

14. A method according to claim 13, further comprising the steps of:

forming the first oxide layer between said regions with the exception of the regions to form a capacitor region and the substrate connecting region of the resistor region, and the first conductivity-type of channel stopper region below the first oxide layer in said first oxide layer formation step;

performing an ion-implantation step to produce a lower electrode of a capacitor on said capacitor region after forming said first oxide layer;

growing an oxide dielectric layer over the lower electrode of the capacitor while growing said second oxide layer;

forming an upper electrode of said capacitor while forming the gates of the first and second MOSFETs;

forming the lower electrode connecting region of said capacitor and the substrate connecting region of the resistor while forming the oxide spacer;

forming an ion-implanting region below a substrate connecting region of said resistor in said fourth ion-implanting step;

forming a connecting window of butting contact portion of said resistor region;

forming a high resistance portion, a butting contact portion and a low resistance portion of the resistor region while etching said second polycrystalline layer;

ion-implaing with a second conductivity-type into the butting contact portion and the low resistance portion of the resistor region in said sixth ion implanting step;

forming connecting windows for the resistor and the capacitor regions while forming said windows for source and drain regions; and connecting the resistor and capacitor region to the conductive layer through said windows.

15. A method of making a BiCMOS semiconductor device including a first and a second MOSFETs, and a first and a second bipolar transistors on a first conductivity-type silicon substrate, said method comprising the steps of:

(a) performing on a first conductivity-type silicon substrate, a second conductivity-type of ion-implantation for producing a first substrate region to thereon form a first MOSFET, and a third and a fourth substrate region to thereon form first and second bipolar transistors respectively on said substrate, wherein a second MOSFET is subsequently formed in a second substrate region located between the first and third substrate regions, and then activating said substrate regions;

(b) forming a first oxide layer between said substrate regions for isolating said respective transistors on said substrate and a first conductivity-type of channel stopper region below said firs oxide layer;

(c) growing a second oxide layer on the exposed substrate for forming each gate oxide layer of said first and second MOSFETs;

(d) depositing a first polycrystalline layer on said second oxide layer, doping a second conductivity-type into the whole surface of the first polycrystalline layer, and then etching the first polycrystalline layer to produce each gate of said first and second MOSFETs on the first and the second substrate regions, respectively;

(e) ion-implanting with a first conductivity-type, for forming each base region of said first and second bipolar transistors on said third and fourth substrate regions, and then activating said base regions;

(f) performing a third ion-implanting step with a second conductivity-type for forming a connecting region of the first substrate region, each collector connecting region of the first substrate region, each collector connecting region of the third and the fourth substrate regions, an emitter region of the second bipolar transistor, and a drain and a source region of the second MOSFET;

(g) performing a fourth ion-implanting step with a first conductivity-type for forming drain and source regions of the first MOSFET of the first substrate region, a connecting region of the second MOSFET of the first substrate region, a connecting region of the second MOSFET of the second substrate region, a base connecting region of the first bipolar transistor of the third substrate region and a base connecting region of the second bipolar transistor of the fourth substrate region;

(h) growing a third oxide layer on the exposed surface of the substrate, performing a process for the activation of the impurities ion-implanted by said third and fourth ion-implanting steps, and raising the density of the third oxide layer surface;

(i) depositing a second polycrystalline layer on the exposed surface of the substrate and etching the second polycrystalline layer to produce a connecting portion for a polycrystalline emitter region of the first bipolar transistor on the third substrate region;

(j) forming a window for producing an emitter region of the first bipolar transistor on the third substrate region an ion-implanting with a second conductivity-type with said window;

(k) performing a fifth ion-implanting step with a second conductivity-type into the second polycrystalline layer of an emitter connecting region of the first bipolar transistor, growing a fourth oxide layer on the exposed substrate surface, and then performing a process for the activation of impurities ion-implanted by said fifth ion-implanting step and raising the density of the fourth oxide layer to produce an emitter region of the first bipolar transistor;

(l) forming windows for each source and drain region of the first and second MOSFETs, each emitter, base and collector region of the first and second bipolar transistors and each connecting region of the substrate regions of the first and second MOSFETs, respectively;

(m) connecting a plurality of said regions to a conductive layer through said windows; and (n) depositing a protecting layer on the whole substrate surface and then exposing a pad for wire-welding.

16. A method according to claim 15, further comprising the steps of:
forming the first oxide layer between said respective substrate regions with the exception of a region to thereon form a capacitor region, and the first conductivity-type of channel stopper region below the first oxide layer in said first oxide layer formation step;

ion-implanting for forming a lower electrode of a capacitor in the capacitor region after forming said first oxide layer;

forming an oxide dielectric layer over the lower electrode of the capacitor in addition to forming the gate oxide layers of the first and the second MOSFETs while growing said second oxide layer;

forming an upper electrode of the capacitor in addition to forming the polycrystalline silicon gate of the first and the second MOSFETs;

forming a connecting region for the lower electrode of the capacitor after forming said base regions;

forming a connecting window for the capacitor region in addition to forming said windows for said plurality of regions;

connecting said capacitor region and to the conductive layer through said connecting window.

17. A method according to claim 15 further comprising the steps of:
forming the first oxide layer between said respective substrate regions and a resistor region with the exception of a region to form a substrate connecting region of the resistor region, and the first conductivity-type of channel stopper region below the first oxide layer in said first oxide formation step;

forming the substrate connecting region of the resister after said base regions;

forming an ion-implanting region under the substrate connecting region of said resistor while forming said connecting region of the first substrate region;

forming a connecting window of butting contact portion of the resistor region while forming said window for producing the emitter region of the first bipolar region;

forming a high resistance portion, a butting contact portion and a low resistance portion of the resistor region while producing said emitter connecting region of the first bipolar transistor;

ion-implanting with a second conductivity-type into the butting contact portion and the low resistance portion of the resistor region;

forming a connecting window for the resistor region;

connecting the resistor region to the conductive layer through said windows; and depositing the protecting layer and exposing the pad for wire-welding.

18. A method according to claim 17, further comprising the steps of:
forming the first oxide layer between said substrate regions with the exception of the regions to form a capacitor region and the substrate connecting region of the resistor region, and the first conductivity-type of said channel stopper region below the first oxide layer in said first oxide layer formation step;

performing an ion-implantation step to produce a lower electrode of a capacitor on said capacitor region after forming said first oxide layer;

growing an oxide dielectric layer over the lower electrode of the capacitor while growing said second oxide layer;

forming an upper electrode of said capacitor while forming the polycrystalline gates of the first and second MOSFET transistors;

forming the lower electrode connecting region of said capacitor and the substrate connecting region of the resistor after forming each said base region;
forming connecting windows for the resistor and the capacitor regions; and
connecting said resistor and capacitor regions to the conductive layer through said windows.

19. A method of making a BiCMOS semiconductor device including a first and a second MOSFETs, and a first bipolar transistor on a first conductivity-type silicon substrate, said method comprising the steps of:
(a) performing on a first conductivity-type silicon substrate, a second conductivity-type of ion-implantation for producing a first substrate region to thereon form a first MOSFET transistor, and a third substrate region to thereon form a first bipolar transistor respectively on said substrate, wherein a second MOSFET transistor may be subsequently formed in a second substrate region being located between the first and third substrate region, and then activating said substrate regions;
(b) forming a first oxide layer between said substrate regions for isolating said respective transistors on said substrate and forming a first conductivity-type of channel stopper region below said first oxide layer;
(c) growing a second oxide layer on a whole substrate surface of said substrate for forming each gate oxide layer of said first and second MOSFET transistors;
(d) depositing a first polycyrstalline layer on said second oxide layer, doping with the second conductivity-type into the whole surface of the first polycrystalline layer, and then etching the first polycrystalline layer to produce each gate of said first and second MOSFET transistors on the first and the second substrate regions, respectively;
(e) ion-implanting with a first conductivity-type, for forming a base region of said first bipolar transistors on said third substrate region, and then activating said base region;
(f) ion-implanting with a second conductivity-type for forming each first source and drain region of said second MOSFET transistor on a second substrate region to thereon form said second MOSFET transistor on said substrate;
(g) sequentially growing third and fourth oxide layers on said substrate surface;
(h) forming an oxide spacer on gate sidewalls of the MOSFET transistors on said first and second substrate regions through etching said third and fourth oxide layers without a separate mask;
(i) performing a fourth ion-implanting step with a second conductivity-type for forming a connecting region of the first substrate region, a collector connecting region of the third substrate region, and second drain and source regions of the second MOSFET transistor;
(j) performing a fifth ion-implaing step with a first conductivity-type for forming drain and source regions of the first MOSFET transistor of the first substrate region, a connecting region of the second MOSFET transistor of the second substrate region, and a base connection region of the first bipolar transistor of the third substrate region;
(k) forming a fifth oxide layer on the exposed surface of the substrate, activating impurities implanted by said fourth and fifth ion implanting steps, and forming a window for producing an emitter region of said first bipolar transistor;
(l) depositing a second polycrystalline layer on the exposed surface on the substrate and forming a connecting portion from said second polycrystalline layer deposited on the emitter region of said first bipolar transistor, and ion implanting said second polycrystalline layer with a second conductivity-type through said window;
(m) depositing a sixth oxide layer on the exposed layer of the substrate;
(n) activating impurities implanted into the second polycrystalline layer to form said emitter region of said first bipolar transistor; and
(o) forming windows for each source and drain region of the first and second MOSFET transistors, each emitter, base and collector region of the first bipolar transistor and each connecting region of the substrate regions of the first and second MOSFET transistors, respectively.

20. A method according to claim 19, further comprising the steps of:
forming the first oxide layer between said respective substrate regions with the exception of a region to thereon form a capacitor region, and the first conductivity-type of channel stopper region below the first oxide layer in said first oxide layer formation step;
ion-implanting for forming a lower electrode of a capacitor in the capacitor region after forming said first oxide layer;
forming an oxide dielectric layer over the lower electrode of the capacitor in addition to forming the gate oxide layers of the first and the second MOSFET transistors while growing said second oxide layer;
forming an upper electrode of the capacitor in addition to forming the gates of the first and the second MOSFET transistors in said step of depositing said first polycrystalline layer;
forming a connecting region for the lower electrode of the capacitor;
forming a connecting window for the capacitor region; and
connecting said capacitor region to the conductive layer through said connecting windows.

21. A method according to claim 19, further comprising the steps of:
forming the first oxide layer between said respective substrate regions and a resistor region with the exception of a region to form a substrate connecting region of a resistor region, and the first conductivity-type of channel stopper region below the first oxide layer in said first oxide layer formation step;
forming an ion-implanting region under the substrate connecting region of said resistor region;
ion-implanting after forming a connecting window of a butting contact portion of the resistor region while forming said window for the emitter region of the first bipolar transistor;
forming a high resistance portion, a butting contact portion and a low resistance portion of the resistor region while processing said second polycrystalline silicon layer;
ion-implanting with a second conductivity-type into the butting contact portion and the low resistance portion of the resistor region during said seventh ion-implanting step;

forming a connecting window for the resistor region while forming said windows for each said source and drain region; and connecting the resistor region to the conductive layer through said windows.

22. A method according to claim 21, wherein said steps further comprising the steps:

forming the first oxide layer between said regions with the exception of the regions to form a capacitor region and the substrate connecting region of the resistor, and the first conductivity-type of said channel stopper region below the first oxide layer in said first oxide layer formation step;

performing an ion-implantation step to produce a lower electrode of a capacitor on said capacitor region after forming said first oxide layer;

growing an oxide dielectric layer over the lower electrode of the capacitor while growing said second oxide layer;

forming an upper electrode of said capacitor while forming the polycrystalline gates of the first and second MOSFET transistors;

forming the lower electrode connecting region of said capacitor and the substrate connecting region of the resistor while forming the oxide spacer;

forming connecting windows for the resistor and the capacitor regions; and connecting said resistor and capacitor regions to the conductive layer through said windows.

23. The method according to claim 19, further comprising:

forming on said first conductivity-type substrate, the second conductivity-type of buried layer for each of said first and third substrate regions; and then producing said first and third substrate regions in correspondence with respective ones of said buried regions.

24. The method according to claim 23, further comprised of growing a first conductivity-type of epitaxial layer on the substrate surface to define said second substrate region, before forming said first oxide layer.

25. A method for making a BiCMOS semiconductor device including a first and a second MOSFET, and a first bipolar transistor on a first conductivity-type silicon substrate, said method comprising the steps of:

(a) performing on a first conductivity-type silicon substrate, a second conductivity-type of ion-implantation for producing a first substrate region to thereon form a first MOSFET transistor, and a third substrate region to thereon from a first bipolar transistor respectively on said substrate, wherein a second MOSFET transistor may be subsequently formed in a second substrate region being located between the first and third substrate region, and then activating said substrate regions;

(b) forming a first oxide layer between said substrate regions for isolating said respective transistors on said substrate and forming a first conductivity-type of channel stopper region below said first oxide layer;

(c) growing a second oxide layer on a whole substrate surface of said substrate for forming each gate oxide layer of said first and second MOSFET transistors;

(d) depositing a first polycrystalline layer on said second oxide layer, doping with the second conductivity-type into the whole surface of the first polycrystalline layer, and then etching the first polycrystalline layer so as to produce each gate of said first and second MOSFET transistors on the first and the second substrate regions, respectively;

(e) ion-implanting with a first conductivity-type, for forming a base region of said first bipolar transistor on said third substrate region, and then activating said base region;

(f) ion-implanting with a second conductivity-type for forming each first source and drain region of said second MOSFET transistor on a second substrate region to thereon form said second MOSFET transistor on said substrate;

(g) sequentially growing third and fourth oxide layers on said substrate surface;

(h) forming an oxide spacer on gate sidewalls of the MOSFET transistors on said first and second substrate regions through etching said third and fourth oxide layers without a separate mask;

(i) performing a fourth ion-implanting step with a second conductivity-type for forming a connecting region of the first substrate region, a collector connecting region of the third substrate region, and second drain and source regions of the second MOSFET transistor;

(j) performing a fifth ion-implanting step with a first conductivity-type for forming drain and source regions for the first MOSFET transistor of the first substrate region, a connecting region of the second MOSFET transistor of the second substrate region, and a base connection region of the first bipolar transistor of the third substrate region;

(k) activating impurities ion-implanted by said fourth and fifth ion-implanting steps, growing a fifth oxide layer on the whole substrate surface, and performing a process for raising the density of the fifth oxide layer;

(l) forming a window for producing an emitter region of the first bipolar transistor on the third substrate region and ion-implanting with a second conductivity-type through said window;

(m) depositing a second polycrystalline layer on the whole of the substrate and etching said second polycrystalline layer to produce a connecting portion for an emitter region of the first bipolar transistor on the third substrate region;

(n) performing a seventh ion-implanting step with a second conductivity-type into the second polycrystalline layer of an emitter connecting region of the first bipolar transistor, growing a sixth oxide layer on the whole substrate surface, and then performing a process for activation of impurities ion-implanted by said seventh ion-implanting step and a thermal process for raising the density of the sixth oxide layer;

(o) forming windows for each source and drain region for the first and second MOSFET transistors, each emitter, base and collector region of the first bipolar transistor and each connecting region of the substrate regions of the first and second MOSFET transistors, respectively;

(p) connecting a plurality of said regions to a conductive layer through said windows; and (q) depositing a protecting layer on the whole substrate surface and then exposing a pad for wire-welding.

26. A method according to claim 25, further comprising the steps of:
   forming the first oxide layer between said respective substrate regions with the exception of a region to thereon form a capacitor region, and the first conductivity-type of channel stopper region below the first oxide layer in said first oxide layer formation step;
   ion-implanting for forming a lower electrode of a capacitor in the capacitor region after forming said first oxide layer;
   forming an oxide dielectric layer over the lower electrode of the capacitor in addition to forming the gate oxide layers of the first and the second MOSFET transistors while growing said second oxide layer;
   forming an upper electrode of the capacitor in addition to forming the gates of the first and the second MOSFET transistors in said step of depositing said first polycrystalline layer;
   forming a connecting region for the lower electrode of the capacitor in addition to forming the oxide spacer on gate sidewalls of the first and the second MOSFET transistors in said step of forming the oxide spacer;
   forming a connecting window for the capacitor region; and
   connecting said capacitor region to a conductive layer through said connecting windows.

27. A method according to claim 25, further comprising the steps of:
   forming the first oxide layer between said respective substrate regions and a resistor region with the exception of a region to form a substrate connecting region of a resistor region, and the first conductivity-type of channel stopper region below the first oxide layer in said first oxide layer formation step;
   forming an ion-implanting region under the substrate connecting region of said resistor region;
   ion-implanting after forming a connecting window of a butting contact portion of the resistor region while forming said window for producing said window for the emitter region of the first bipolar transistor;
   forming a high resistance portion, a butting contact portion and a low resistance portion of the resistor region while processing said second polycrystalline layer;
   ion-planting with a second conductivity-type into the butting contact portion and the low resistance portion of the resistor region during said seventh ion-implanting step;
   forming a connecting window for the resistor region while forming said windows for each said source and drain region; and
   connecting the resistor region to the conductive layer through said windows.

28. A method according to claim 27, wherein said steps further comprising the steps:
   forming the first oxide layer between said regions with the exception of regions to form a capacitor region and the substrate connecting region of the resistor, and the first conductivity-type of said channel stopper region below the first oxide layer in said first oxide layer formation step;
   performing an ion-implantation step to produce a lower electrode of a capacitor on said capacitor region after forming said first oxide layer;
   growing an oxide dielectric layer over the lower electrode of the capacitor while growing said second oxide layer;
   forming an upper electrode of said capacitor while forming the gates of the first and second MOSFET transistors;
   forming the lower electrode connecting region of said capacitor and the substrate connecting region of the resistor while forming the oxide spacer;
   forming connecting windows for the resistor and the capacitor regions; and
   connecting said resistor and capacitor regions to the conductive layer through said windows.

29. The method according to claim 25, further comprising:
   forming on said first conductivity-type substrate, the second conductivity-type of buried layer for each of said first and third substrate regions; and
   then producing said first and third substrate regions in correspondence with respective ones of said buried regions.

30. The method according to claim 29, further comprised of growing a first conductivity-type of epitaxial layer on the substrate surface to define said second substrate region, before forming said first oxide layer.

31. A method of making a BiCMOS semiconductor device including a first and a second MOSFET, and a first bipolar transistor on a first conductivity-type semiconductor material substrate, said method comprising the steps of:
   (a) performing on a first conductivity-type semiconductor material substrate, a second conductivity-type of ion-implantation for producing a first substrate region to thereon form a first MOSFET transistor, and a third substrate region to thereon form a first bipolar transistor respectively on said substrate, wherein a second MOSFET transistor may be subsequently formed in a second substrate region being located between the first and third substrate region, and then activating said substrate regions;
   (b) forming a first oxide layer between said substrate regions for isolating said respective transistors on said substrate and forming a first conductivity-type of channel stopper region below said first oxide layer;
   (c) growing a second oxide layer on a whole substrate surface of said substrate for forming each gate oxide layer of said first and second MOSFET transistors;
   (d) depositing a first polycrystalline layer on said second oxide layer, doping with the second conductivity-type into the whole surface of the first polycrystalline layer, and then etching the first polycrystalline layer to produce each gate of said first and second MOSFET transistors on the first and the second substrate regions, respectively;
   (e) ion-implanting with a first conductivity-type, for forming a base region of said first bipolar transistor on said third substrate region, and then activating said base region;
   (f) partially removing said second oxide layer from said substrate surface;
   (g) performing a third ion implanting step with a second conductivity-type for forming a connecting region of the first substrate region, source and drain region of the second MOSFET transistor, and a collector connecting region of the first bipolar transistor;

(h) performing a fourth ion-implanting step with a first conductivity-type for forming drain and source regions and the first MOSFET transistor of the first substrate region, a connecting region of the second MOSFET transistor of the second substrate region, and a base connection region of the first bipolar transistor of the third substrate region;

(i) activating impurities ion-implanted by said third and fourth ion implanting steps, growing a third oxide layer on the whole substrate surface, and raising the density of the third oxide layer;

(j) forming a window for producing an emitter region of the first bipolar transistor on the third substrate region and the ion-implanting with a second conductivity-type through said window;

(k) depositing a second polycrystalline layer on the whole of the substrate and etching said second polycrystalline layer to produce a connecting portion for a polycrystalline emitter region of the first bipolar transistor on the third substrate region;

(l) performing a fifth ion-implanting step with a second conductivity-type into the second polycrystalline layer of an emitter connecting region of the first bipolar transistor, growing a fourth oxide layer on the whole substrate surface, and then activating impurities ion-implanted by said fifth ion-implanting step and raising the density of the fourth oxide layer; and (m) forming windows for each source and drain region for the first and second MOSFET transistors, each emitter, base and collector region of the first bipolar transistor and each connecting region of the substrate regions of the first and second MOSFET transistors, respectively.

32. A method according to claim 31, further comprising the steps of:

forming the first oxide layer between said respective substrate regions with the exception of a region to thereon form a capacitor region, and the first conductivity-type of channel stopper region below the first oxide layer in said first oxide layer formation step;

ion-implanting for forming a lower electrode of a capacitor in the capacitor region after forming said first oxide layer;

forming an oxide dielectric layer over the lower electrode of the capacitor in addition to forming the gate oxide layers of the first and the second MOSFET transistors while growing said second oxide layer;

forming an upper electrode of the capacitor in addition to forming the gates of the first and the second MOSFET transistors in said step of depositing said first polycrystalline layer;

forming a connecting region for the lower electrode of the capacitor in addition to forming the oxide spacer of gate sidewalls of the first and the second MOSFET transistors in said step of forming the oxide spacer;

forming a connecting window for the capacitor region; and connecting said capacitor region to a conductive layer through said connecting windows.

33. A method according to claim 31, further comprising the steps of:

forming the first oxide layer between said respective substrate regions and a resistor region with the exception of a region to form a substrate connecting region of a resistor region, and the first conductivity-type of channel stopper region below the first oxide layer in said first oxide layer formation step;

forming an ion-implanting region under the substrate connecting region of said resistor region while performing said fourth ion-implanting step;

ion-implanting after forming a connecting window of a butting contact portion of the resistor region while forming said window for producing said window for the emitter region of the first bipolar transistor;

forming a high resistance portion, a butting contact portion and a low resistance portion of the resistor region while etching said second polycrystalline layer;

ion-implanting with a second conductivity-type into the butting contact portion and the low resistance portion of the resistor region during said seventh ion-implanting step;

forming a connecting window for a resistor region while forming said windows for each said source and drain region; and connecting the resistor region to the conductive layer through said windows.

34. A method according to claim 33, wherein said steps further comprising the steps:

forming the first oxide layer between said regions with the exception of the regions to form a capacitor region and the substrate connecting region of the resistor, and the first conductivity-type of said channel stopper region below the first oxide layer in said first oxide layer formation step;

performing an ion-implantation step to produce a lower electrode of a capacitor on said capacitor region after forming said first oxide layer;

growing an oxide dielectric layer over the lower electrode of the capacitor while growing said second oxide layer;

forming an upper electrode of said capacitor while forming the gates of the first and second MOSFET transistors;

forming the lower electrode connecting region of said capacitor and the substrate connecting region of the resistor while forming the oxide spacer;

forming connecting windows for the resistor and the capacitor regions; and connecting said resistor and capacitor regions to a conductive layer through said windows.

35. The method according to claim 31, further comprising:

forming on said first conductivity-type substrate, the second conductivity-type of buried layer for each of said first and third substrate regions; and then producing said first and third substrate regions in correspondence with respective ones of said buried regions.

36. The method according to claim 35, further comprised of growing a first conductivity-type of epitaxial layer on the substrate surface to define said second substrate region, before forming said first oxide layer.

* * * * *